(12) United States Patent
Pichai et al.

(10) Patent No.: US 12,432,888 B2
(45) Date of Patent: Sep. 30, 2025

(54) DATA CENTER RACK SYSTEM

(71) Applicant: Equinix, Inc., Redwood City, CA (US)

(72) Inventors: Tikhon Suresh Pichai, Simpsonville, SC (US); Bhavin Raju Shah, Sunnyvale, CA (US); David James Asher Hall, London (GB); Douglas James Asay, San Jose, CA (US)

(73) Assignee: Equinix, Inc., Redwood City, CA (US)

( * ) Notice: Subject to any disclaimer, the term of this patent is extended or adjusted under 35 U.S.C. 154(b) by 570 days.

(21) Appl. No.: 17/663,371

(22) Filed: May 13, 2022

(65) Prior Publication Data

US 2022/0386514 A1   Dec. 1, 2022

Related U.S. Application Data

(62) Division of application No. 16/994,386, filed on Aug. 14, 2020, now Pat. No. 11,337,339.

(Continued)

(51) Int. Cl.
*H05K 7/14* (2006.01)
*H05K 7/20* (2006.01)

(52) U.S. Cl.
CPC ....... *H05K 7/20718* (2013.01); *H05K 7/1487* (2013.01); *H05K 7/1488* (2013.01);
(Continued)

(58) Field of Classification Search
CPC .............. H05K 7/1487; H05K 7/1488; H05K 7/20172; H05K 7/20718; H05K 7/20736;
(Continued)

(56) References Cited

U.S. PATENT DOCUMENTS 7,472,970 B2   1/2009   Bergesch et al.
7,534,167 B2   5/2009   Day
(Continued)

FOREIGN PATENT DOCUMENTS

| CN | 102027296 A | 4/2011 |
| CN | 102402256 A | 4/2012 |
| EP | 2900045 A1 | 7/2015 |

OTHER PUBLICATIONS

Communication pursuant to Article 94(3) EPC from counterpart European Application No. 20764511.0 dated Oct. 13, 2022, 12 pp.

(Continued)

*Primary Examiner* — Mark A Connolly
(74) *Attorney, Agent, or Firm* — Shumaker & Sieffert, P.A.

(57) ABSTRACT

This disclosure describes systems for arranging racks within a data center for a smaller and/or more flexible footprint, more efficient and/or resilient cooling, and/or easier installation. In some examples, this disclosure describes a data center rack system that includes an aisle and a plurality of rack stations adjacent to the aisle. The aisle includes an aisle guidance track defining an aisle axis. Each rack station of the plurality of rack stations includes a station guidance track defining a station axis. The station guidance track is configured to receive a rack from the aisle guidance track and position the rack in the respective rack station at a rack angle formed between the aisle axis and the station axis that is less than 90 degrees.

18 Claims, 9 Drawing Sheets

Related U.S. Application Data

(60) Provisional application No. 62/887,474, filed on Aug. 15, 2019.

(52) U.S. Cl.
CPC ..... *H05K 7/20172* (2013.01); *H05K 7/20736* (2013.01); *H05K 7/20763* (2013.01); *H05K 7/20781* (2013.01); *H05K 7/20836* (2013.01)

(58) Field of Classification Search
CPC ........... H05K 7/20763; H05K 7/20781; H05K 7/20836
See application file for complete search history.

(56) References Cited

U.S. PATENT DOCUMENTS

| | | | |
|---|---|---|---|
| 8,659,895 | B1 | 2/2014 | Carlson et al. |
| 8,763,414 | B2 | 7/2014 | Carlson et al. |
| 9,104,387 | B1 | 8/2015 | Eichelberg |
| 9,603,281 | B2 | 3/2017 | Crosby, Jr. |
| 9,785,505 | B1* | 10/2017 | Narzisi ............... G06F 11/1675 |
| 10,165,710 | B1 | 12/2018 | Pompei et al. |
| 2003/0002201 | A1 | 1/2003 | Gupta et al. |
| 2004/0089010 | A1* | 5/2004 | Patel ........................ F25B 49/02 62/186 |
| 2004/0105187 | A1 | 6/2004 | Woodruff et al. |
| 2006/0082263 | A1 | 4/2006 | Rimier et al. |
| 2009/0229194 | A1 | 9/2009 | Armillas |
| 2009/0241578 | A1 | 10/2009 | Carlson et al. |
| 2009/0260874 | A1 | 10/2009 | Eckberg et al. |
| 2010/0032142 | A1* | 2/2010 | Copeland ........... H05K 7/20836 700/282 |
| 2011/0023388 | A1 | 2/2011 | Tong et al. |
| 2012/0024501 | A1* | 2/2012 | Campbell .......... H05K 7/20236 165/104.33 |
| 2012/0136484 | A1 | 5/2012 | Wang et al. |
| 2012/0155027 | A1 | 6/2012 | Broome et al. |
| 2012/0164930 | A1* | 6/2012 | Murayama ............... F24F 11/63 454/184 |
| 2012/0200992 | A1 | 8/2012 | Schmitt et al. |
| 2012/0300398 | A1 | 11/2012 | Eckberg et al. |
| 2014/0020885 | A1* | 1/2014 | Chainer ............. H05K 7/20836 165/287 |
| 2015/0062817 | A1* | 3/2015 | Lin .................... H05K 7/20772 361/720 |
| 2015/0085442 | A1* | 3/2015 | Kondo ............... H05K 7/20809 361/679.54 |
| 2015/0351287 | A1* | 12/2015 | Eichelberg ................ G06F 1/20 29/434 |
| 2016/0198592 | A1 | 7/2016 | Schmitt et al. |
| 2018/0020577 | A1 | 1/2018 | Franz |
| 2018/0027701 | A1 | 1/2018 | Kam et al. |
| 2020/0284480 | A1* | 9/2020 | Tolouei Asbforoushani ............... F25B 25/005 |
| 2020/0404813 | A1* | 12/2020 | Gao ................... H05K 7/20745 |
| 2021/0051820 | A1 | 2/2021 | Pichai et al. |

OTHER PUBLICATIONS

Second Office Action, and Translation Thereof, from counterpart Chinese Application No. 202080003392.0 dated Jul. 4, 2023, 6 pp.

EP-2900045A 1 English Translation (Year: 2015).

Evans, "The Different Technologies for Cooling Data Centers," APC, Schneider Electric White Paper 59, Revision 2, 2012, 16 pp. (Applicant points out, in accordance with MPEP 609.04(a), that the year of publication, <2012>, is sufficiently earlier than the effective U.S. filing date, so that the particular month of publication is not in issue.).

International Preliminary Report on Patentability from International Application No. PCT/US2020/046527, dated Feb. 24, 2022, 12 pp.

International Search Report and Written Opinion of International Application No. PCT/US2020/046527, mailed Jan. 19, 2021, 18 pp.

Invitation to Pay Additional Fees and, Where Applicable, Protest Fee from International Application No. PCT/ JS2020/046527, dated Nov. 20, 2020, 12 pp.

Response to Communication Pursuant to Rules 161(1) EPC dated Feb. 9, 2021, from counterpart European Application No. 20764511.0, filed Aug. 5, 2021, 15 pp.

Prosecution History from U.S. Appl. No. 16/994,386, dated Jun. 15, 2021 through Apr. 4, 2022, 55 pp.

Response to Communication pursuant to Article 94(3) EPC dated Oct. 13, 2022, from counterpart European Application No. 20764511.0 filed Feb. 9, 2023, 89 pp.

First Office Action and Search Report, and translation thereof, from counterpart Chinese Application No. 202080003392.0 dated Jan. 28, 2023, 8 pp.

First Examination Report from counterpart Australian Application No. 2020281024 dated Feb. 4, 2025, 5 pp.

Notice of Intent to Grant and Text Intended to Grant from counterpart European Application No. 20764511.0 dated May 20, 2025, 8 pp.

Response to Office Action, from counterpart Singapore Application No. 11202011876X filed Jul. 24, 2025, 15 pp.

\* cited by examiner

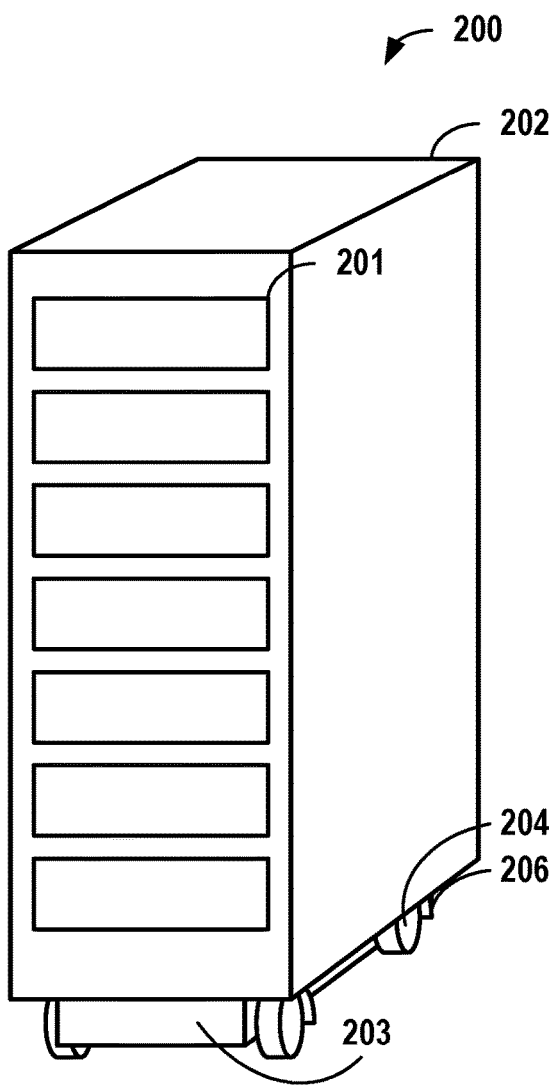
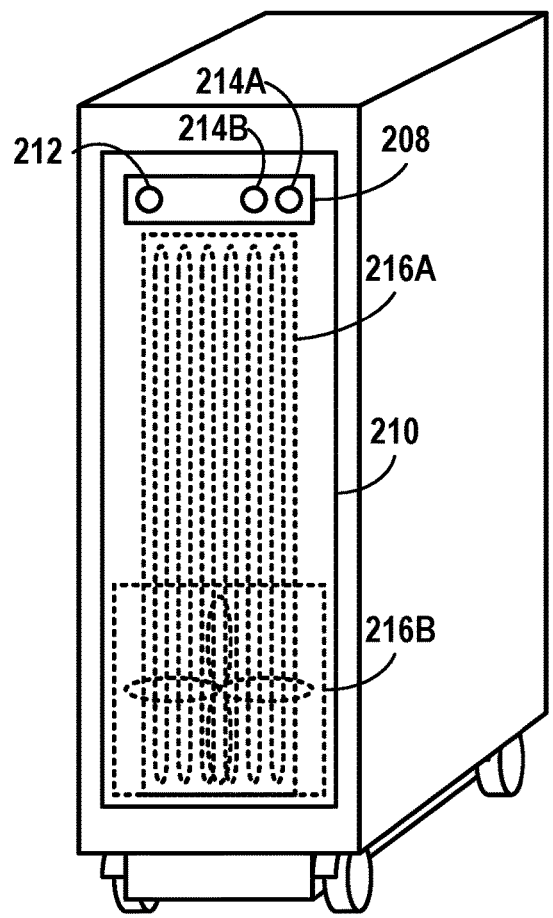
FIG. 2A
FIG. 2B

DATA CENTER RACK SYSTEM

RELATED APPLICATIONS

This application is a divisional of U.S. patent application Ser. No. 16/994,386, filed Aug. 14, 2020, which claims the benefit of U.S. Provisional Application No. 62/887,474, filed Aug. 15, 2019, the entire contents of each being incorporated herein by reference.

TECHNICAL FIELD

This disclosure relates to data centers, and more specifically, to rack arrangement systems for data centers.

BACKGROUND

Computing devices, such as servers and networking equipment, may be installed in racks that provide structure, security, and/or connectivity to the computing devices. To cool the computing devices, these racks may be arranged in parallel pairs of rows with a cold aisle between each pair of rows and perpendicularly oriented so that each rack has at least one side facing the cold aisle and at least one side facing a hot aisle. Each rack is cooled by receiving cooling air from the cold aisle and discharging warmer air to the hot aisle. Adjacent racks within a row may be tightly fitted to contain cooling air within the cold aisle and prevent the cooling air from passing between adjacent racks to the hot aisle. To achieve this tight fit, racks within a row may be fixed along the row, such that computing devices may be installed and/or removed directly from the fixed rack.

SUMMARY

This disclosure describes systems for arranging racks within a data center. A data center rack system may include a central aisle and racks positioned in rack stations adjacent to the central aisle. The rack stations may be arranged in parallel rows and oriented at acute angles from the aisle. The data center rack system may include an aisle guidance track along the aisle and a station guidance track at each rack station. The aisle guidance track may direct a rack along the aisle. The station guidance tracks may position the rack in a rack station at the acute angle.

Such data center rack systems may have smaller and/or more configurable footprints than data center rack systems that utilize perpendicularly oriented racks. For example, the angled orientation of the rack stations of the data center rack systems may allow racks to be positioned in a more flexible footprint than perpendicular rack orientations found in hot aisle and cold aisle arrangements, such as a footprint having narrower aisles. As another example, the angled orientation of the rack stations may reduce an amount of clearance space, and corresponding aisle space, when removing a rack from a rack station into the aisle. In these ways, rows of racks may be positioned in dimensionally constrained spaces and/or in configurations that permit a higher density of racks for a predetermined footprint.

In some examples, angled data center racks systems may have an overall width for two opposed rows of racks and the associated cold and hot aisles (total 'pitch' per set of cabinet rows) that may also be less for such angled racks. By reducing a pitch of the rack systems, the rack systems may be easier and/or less expensive to transport. For example, local regulations may govern road transportable widths of cargo. Angular rack deployment-based designs described herein may permit easier road transportability of modular data centers with greater number of cabinets per modular unit.

Such data center rack systems may provide easier and/or more secure installation and/or removal of computing devices than data center rack systems that utilize fixed racks. For example, the aisle and/or station guidance tracks may engage with guidance mechanisms on the racks for quick installation and/or removal of racks from the rack stations. As a result, installation, removal, and/or maintenance of computing devices in the racks may be performed away from the data center rack systems. In this way, racks may be maintained with a reduced or eliminated floor area for performing maintenance.

In some examples, the data center rack systems described herein may provide more resilient and/or efficient cooling than data center rack systems that utilize contained cold aisle configurations. For example, in accordance with aspects of this disclosure, the rack stations within a row may be spaced such that adjacent racks positioned in the rack stations are separated by a cooling gap that permits cooling air flowing down the cold aisle to flow between the adjacent racks, especially to address racks with form factors different from the baseline racks. Such gaps may be employed also in association with cabinets deploying rear door cooling heat exchangers to provide supplemental cooling for cabinets with power densities higher than the base average design power density. In such cases the airflow in the gaps would be in the hot aisle to cold aisle (reverse direction), and may have baffles to facilitate air flow in such a manner. This cooling air may be shared among racks in a rack section associated with the aisle to provide a baseline cooling for the racks. In some examples, rack stations may further include cooling fluid connections that may provide liquid cooling at the component, server or the rack level to supplement cooling air, thereby allowing customized, augmented cooling for individual racks while continuing to provide the baseline cooling.

In some examples, a data center rack system includes an aisle and a plurality of rack stations adjacent to the aisle. The aisle may include an aisle guidance track defining an aisle axis. Each rack station of the plurality of rack stations may include a station guidance track defining a station axis. The station guidance track may then be configured to receive a rack from the aisle guidance track and position the rack in the respective rack station at a rack angle formed between the aisle axis and the station axis that is less than 90 degrees.

In some examples, the data center rack system described above further includes a plurality of racks. Each rack of the plurality of racks includes a frame, a guidance mechanism, and an anchoring mechanism. The frame defines a rack volume. The guidance mechanism is coupled to the frame and configured to engage the aisle guidance track and a respective station guidance track. The anchoring mechanism is coupled to the frame and configured to anchor the rack at the rack station.

In some examples, a data center rack system includes one or more rack sections. Each rack section includes an aisle and a plurality of rack stations adjacent to the aisle. The aisle includes an aisle guidance track defining an aisle axis. The plurality of rack stations includes a first plurality of rack stations on a first side of the aisle and a second plurality of rack stations on a second side of the aisle. Each rack station of the plurality of rack stations includes a station guidance track defining a station axis. The station guidance track is configured to receive a rack from the aisle guidance track and position the rack in the respective rack station at a rack angle formed between the aisle axis and the station axis that is less than 90 degrees.

In some examples, a method by a controller for providing cooling to a rack of a data center rack system includes receiving a temperature measurement for a rack of a plurality of racks. Each rack of the plurality of racks is positioned in a respective rack station at a rack angle formed between an aisle axis of an aisle and a station axis of the respective rack station that is less than 90 degrees. The method further includes determining whether the temperature measurement is greater than a threshold and, in response to determining that the temperature measurement is greater than the threshold, increasing at least one of a flow rate of cooling air from a forced air cooling system to the plurality of racks or a flow rate of cooling liquid from a liquid cooling system to the rack of the plurality of racks.

In some examples, a method for positioning a rack in a data center rack system includes transporting a rack along an aisle comprising an aisle guidance track defining an aisle axis. The method further includes receiving the rack from the aisle guidance track into a station guidance track of a rack station of a plurality of rack stations adjacent to the aisle. Each rack station of the plurality of rack stations comprises a station guidance track defining a station axis. The method further includes positioning the rack in the respective rack station at a rack angle formed between the aisle axis and the station axis that is less than 90 degrees.

BRIEF DESCRIPTION OF THE DRAWINGS

FIG. 2A is a conceptual diagram illustrating a front perspective view of an example data center rack, in accordance with one or more aspects of the present disclosure.

FIG. 2B is a conceptual diagram illustrating a rear perspective view of the example data center rack of FIG. 2A, in accordance with one or more aspects of the present disclosure.

DETAILED DESCRIPTION

Figure 1A:
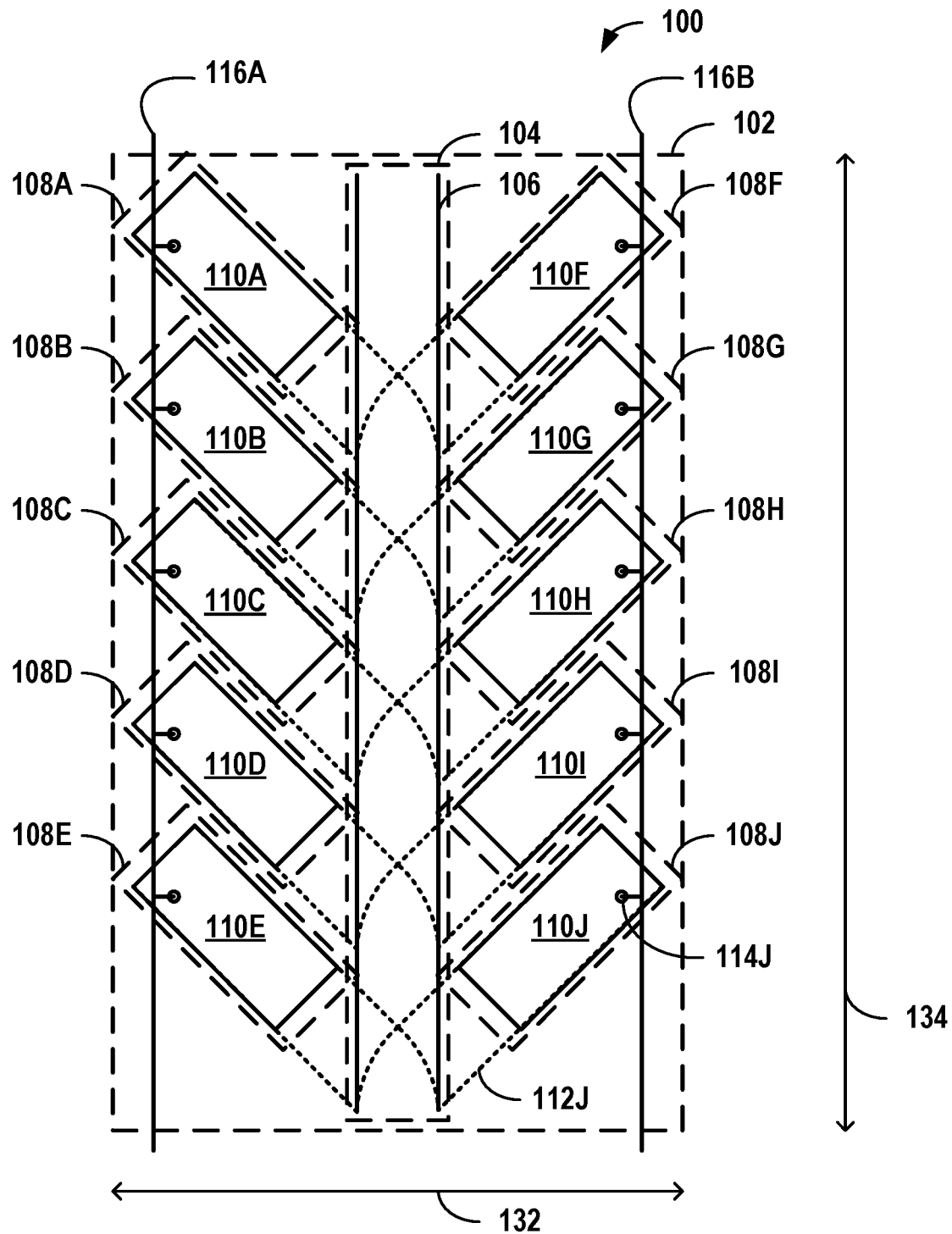
FIG. 1A is a conceptual diagram illustrating a top view of an example data center rack system for arranging racks in a data center, in accordance with one or more aspects of the present disclosure.

FIG. 1A is a conceptual diagram illustrating a top view of an example data center rack system 100 for arranging racks in a data center, in accordance with one or more aspects of the present disclosure. The example of FIG. 1A illustrates a single rack section 102 of data center rack system 100; however, as will be illustrated in FIG. 1D, data center rack system 100 may include multiple rack sections 102 (referred to individually as "rack section 102" and collectively as "rack sections 102").

Rack section 102 of data center rack system 100 includes an aisle 104 and a plurality of racks stations 108A-108J (referred to individually as "rack station 108" and collectively as "rack stations 108") adjacent to aisle 104. As shown in FIG. 1A, rack section 102 includes a first plurality of rack stations 108A-108E in a first row on a first side of aisle 104 and a second plurality of rack stations 108F-108J in a second row on a second side of aisle 104; however, in other examples, a rack section may include a single row on a single side of aisle 104. In the example of FIG. 1A, rack section 102 includes ten rack stations 108; however, any number of rack stations 108 may be included in rack section 102, including different numbers of rack stations 108 in various rack sections 102 within data center rack system 100.

In the example of FIG. 1A, data center rack system 100 includes a plurality of racks 110A-J (referred to individually as "rack 110" and collectively as "racks 110") positioned in respective rack stations 108. Each rack 110 may be configured to provide structure, security, and/or connectivity to computing devices within rack 110. Various configurations and features of racks 110 will be discussed further in FIGS. 2A and 2B.

Each rack section 102 may represent a grouping of rack stations 108 that share a particular aisle 104. Each rack section 102 may have a footprint defining a floor space of a data center that includes aisle 104, rack stations 108, and any bordering space around rack stations 108, such as may be used for cooling, maintenance, and the like. As such, the footprint of rack section 102 may have a variety of shapes and sizes that depend on a variety of characteristics of aisle 104 and/or rack stations 108, such as a size, shape, and orientation of aisle 104 and/or rack stations 108, number of rows of rack stations 108, and the like. In the example of FIG. 1A, rack section 102 includes a footprint defined by a y-dimension 134 parallel to aisle 104 and an x-dimension 132 perpendicular to aisle 104.

In some examples, rack section 102 may represent a modular, pre-fabricated section of data center rack system 100. For example, fabrication of a data center in an urban environment may be difficult due to space and working constraints. To more quickly and/or easily build data center rack system 100 at a data center site, modular sections of data center rack system 100 may be fabricated off-site and transported to the data center site. In such examples, rack section 102 may be sized based on dimensional constraints of the data center site and/or a mode of transportation. As an example of dimensional constraints arising from the mode of transportation, particular jurisdictions may have limits on road shipping loads having a width or length above a threshold. For instance, some states require costly pilot vehicles to lead and follow trucks hauling oversize loads greater than about 12 feet or about 14 feet. As such, rack section 102 may be sized within legal requirements and/or industry practices or standards for shipping by road, sea, and/or air. For example, such x-dimension 132 and y-dimension 134 may correspond to a dimensional limit for road shipping, as discussed above.

In some examples, rack section 102 may be sized for transport in a shipping container and/or for a footprint of a shipping container. For example, rack section 102 has y-dimension 134 less than or equal to about 20 feet and x-dimension 132 less than or equal to about 12 feet or about 14 feet. Such a size of rack section 102 may enable rack section 102 to be fabricated and assembled overseas, transported in a shipping container to a site of the data center, and assembled with other rack sections 102.

In some examples, rack section 102 may represent a segregated, modular unit associated with a single tenant of a data center. For example, a data center may include a tenant that wishes to retain physical custody of computing devices in multiple racks 110. These multiple racks 110 may be enclosed in a rack section 102 that includes a physical boundary (e.g., fire-rated walls) and a restricted entryway (e.g., a locked door) to segregate rack section 102 from other rack sections and restrict physical access to racks 110 of rack section 102. In some examples, rack section 102 may represent a smallest secure, modular unit available for purchase/rent by a tenant. In some examples, rack section 102 may include a single row of racks, such as illustrated in rack section 102D of FIG. 1D. For example, a floor space in a data center may be limited in y-dimension 134, such that a single row of racks may fit into the limited y-dimension 134, whereas a hot or cold aisle contained rack configuration may not accommodate such a layout.

Within rack section 102, each rack station 108 may represent a predetermined position for positioning a respective rack 110. For example, each rack station 108 may position a respective rack 110 by securing the respective rack 110 within the respective rack station 108 at a particular orientation and providing various utilities to the respective rack 110 positioned in the respective rack station 108. As such, rack stations 108 within a rack section may be positioned (e.g., oriented and spaced) to achieve a particular orientation and/or spacing of racks 110 within rack section 102. For purposes of explanation, rack stations 108 are illustrated as including a footprint (dashed line) greater than a footprint of a corresponding rack 110; however, rack stations 108 may have any or no footprint.

Aisle 104 may be configured to provide a transportation path for racks 110 installed into and/or removed from rack section 102. To assist in transporting racks 110 to and from rack stations 108, aisle 104 includes an aisle guidance track 106. Aisle guidance track 106 may be configured to interface with a guidance mechanism (not shown) of rack 110 to direct rack 110 through aisle 104. While shown in a straight configuration, aisle guidance track 106 may have any shape. During installation of rack 110, aisle guidance track 106 may receive rack 110, such as from outside rack section 102 or from another rack station 108, and discharge rack 110 to a respective rack station 108. During removal of rack 110, aisle guidance track 106 may receive rack 110 from a respective rack station 108 and discharge rack 110 to outside rack section 102 or to another rack station 108. In some examples, aisle 104 may be configured to temporarily store rack 110 during in-section maintenance of rack 110. For example, rack 110 may be discharged from rack station 108 into aisle 104 prior to maintenance to provide a technician sufficient room and access to perform maintenance, and returned to the respective rack station 108 after maintenance is complete.

Each rack station 108 may be configured to receive a rack 110 from aisle guidance track 106 and position rack 110 at an acute angle to aisle 104. To assist in positioning a respective rack 110, each rack station 108 includes a station guidance track 112. Station guidance track 112 may be configured to interface with a mechanism (not shown) of rack 110 to direct rack 110 into position in rack station 108. While shown in a straight configuration for an inner radius track and both a curved and straight configuration for an outer radius track, station guidance track 112 may have any shape. During installation of rack 110, station guidance track 112 may receive rack 110 from aisle guidance track 106 and position rack 110 in a predetermined position in rack station 108. During removal of rack 110, station guidance track 112 may discharge rack 110 to aisle guidance track 106.

Aisle guidance track 106 and each station guidance track 112 may include any guidance track capable of interfacing with and directing rack 110 down aisle 104 and into rack station 108, respectively. While shown as two tracks in the example of FIG. 1A, aisle guidance track 106 and/or each station guidance track 112 may include any number of tracks, including differing numbers of tracks between aisle guidance track 106 and station guidance track 112.

In some examples, aisle guidance track 106 and/or station guidance track 112 may include physical structures configured to physically interface with rack 110. For example, aisle guidance track 106 and/or station guidance track 112 may physically contact a portion of rack 110 or physically interface with a guidance mechanism of rack 110 to define a direction of movement of rack 110 along the respective aisle guidance track 106 or station guidance track 112. In some examples, aisle guidance track 106 and/or each station guidance track 112 may include depressions in a floor. For example, aisle guidance track 106 and/or each station guidance track 112 may include one or more elongated depressions that are each (or in combination) configured to receive a guidance mechanism, such as wheels or projections, of rack 110, such that lateral movement of the guidance mechanism is bounded by the sides of the elongated depression. In some examples, aisle guidance track 106 and each station guidance track 112 include raised tracks on a floor. For example, aisle guidance track 106 and/or each station guidance track 112 may include one or more elongated raised tracks that are each (or in combination) configured to project into or alongside a guidance mechanism, such as a guide or edge, of rack 110, such that lateral movement of the guidance mechanism is bounded by sides of the elongated raised tracks. In some examples, aisle guidance track 106 and/or each station guidance track 112 may include rails above racks 110, which may be suspended from a ceiling, for example. For example, aisle guidance track 106 and/or each station guidance track 112 may include one or more elongated rails that are each (or in combination) configured to project into or alongside a guidance mechanism, such as a guide or edge, of rack 110, such that lateral movement of the guidance mechanism is bounded by sides of the elongated rails.

In some examples, aisle guidance track 106 and/or station guidance track 112 may include marks configured to indicate a path of rack 110. For example, aisle guidance track 106 and/or station guidance track 112 may visually indicate a direction of movement of rack 110 along the respective aisle guidance track 106 or station guidance track 112. In some examples, aisle guidance track 106 and/or each station guidance track 112 may include human-readable marks on a floor. For example, aisle guidance track 106 and/or each station guidance track 112 may include one or more strips or marks that are each (or in combination) configured to indicate a path along which to guide rack 110. In some examples, aisle guidance track 106 and/or each station guidance track 112 may include machine-readable marks on a floor. For example, aisle guidance track 106 and/or each station guidance track 112 may include one or more strips or marks that are each (or in combination) configured to indicate a path along which an autonomous or semi-autonomous vehicle may guide rack 110 along aisle 104 and into position in a respective rack station 108.

In some examples, data center rack system 100 may include a floor (not labeled). The floor may include one or more structures (e.g., elongated depressions or elongated raised tracks) corresponding to aisle guidance track 106 and/or station guidance tracks 112. In some examples, the floor may be a platform raised above a base floor. The floor may also include various features for housing and/or accessing utilities for racks 110. In some examples, the floor may include a floor plenum configured to house utility connections corresponding to connector 114, such as electrical power (e.g., via power cable), data transfer (e.g., via metal or fiber optic cable), cooling (e.g., via cooling fluid piping), accessory systems such as control or security (e.g., via wiring), or any other utility or functionality that may be utilized by rack 110 or computing devices housed by rack 110. The floor plenum may have containment features, such as sealed containments for capturing and/or routing any leaked fluid. The floor plenum may include access points, such as panels, that may be removed to access valves, switches, or other equipment associated with utilities corresponding to connector 114. By housing utilities corresponding to connector 114 in a floor plenum, data center rack system 100 may have reduced congestion, interference, or uncontained leakage as compared to data center rack systems in which utilities are not contained in a floor plenum.

Aisle guidance track 106 and/or station guidance tracks 112 may permit rack section 102 to operate with a smaller floor area for maintenance, and thereby smaller footprint, than a data center rack system that includes fixed racks. For example, in data center rack systems that include fixed racks, a floor area adjacent to each rack may be required for a technician to access computing devices in the rack. However, data center rack system 100 may reduce an amount of floor area for maintenance by enabling racks 110 to be removed from or within rack section 102. For example, assembly of computing devices into rack 110 may be performed outside of rack section 102, such that a floor area near racks 110 may not be required for installation. For transfer of computing devices from a first rack section 102 to a second rack section 102, the respective rack 110 may be removed from the first rack section 102 and installed into the second rack section 102 without removing the computing devices from the respective rack 110. For out-of-section maintenance of rack 110, rack 110 may be removed from the respective rack station 108 and rack section 102 and returned to the respective rack station 108 once maintenance is complete. For in-section maintenance of rack 110, station guidance track 112 may discharge rack 110 into aisle 104 to allow access to a rear or lateral side of rack 110, and receive rack 110 back into the respective rack station 108 once in-section maintenance is complete.

In some examples, aisle 104 may be configured to provide a cooling path for cooling air to racks 110. For example, cooling air supplied by a forced air cooling system (not shown) of the data center may flow down aisle 104 to racks 110 to provide convective air cooling to computing devices within racks 110. The cooling air may flow around each rack 110 and/or through an interior of each rack 110, such as from a front of rack 110 facing aisle 104 to a rear of rack 110 facing away from aisle 104, or vice versa. In some examples, cooling air may flow along lateral sides of rack 110. For example, as will be explained further in FIG. 1B, racks 110 in a row of rack stations 108 of rack section 102 may be spaced apart, such that cooling air may flow between adjacent racks 110. As a result, cooling air may flow across a high amount of surface area of racks 110 for improved cooling.

In some examples, each rack station 108 may include a connector 114 (referred to individually as "connector 114" and collectively as "connectors 114"). Each connector 114 may be coupled to one or more utility sources and configured to couple to a respective rack 110 positioned in the respective rack station 108 to connect the respective rack 110 to one or more utility sources. For example, connector 114 may include one or more connection interfaces configured to couple to one or more connection interfaces of rack 110 or computing devices within a respective rack 110. In some examples, connector 114 may directly couple to the computing devices, while in other examples, connector 114 may indirectly couple to the computing devices through a utility distribution device in rack 110, such as a power supply or cooling fluid manifold.

Each connector 114 may be configured to supply various utilities to rack 110 including, but not limited to, electrical power (e.g., via power cable), data transfer (e.g., via metal or fiber optic cable), cooling (e.g., via cooling fluid piping), accessory systems such as control or security (e.g., via wiring), or any other utility or functionality that may be utilized by rack 110 or computing devices housed by rack 110. For example, connector 114 may include an electrical plug configured to interface with a power supply of a computing device or rack 110, a pipe socket configured to interface with a liquid cooling manifold of rack 110, a network cable configured to interface with a network port of a computing device or rack 110, and the like. As will be explained further in FIG. 1D, connectors 114 may be coupled to various utility sources, such as electrical power sources (e.g., power grid, back-up generator), data transfer conduits (e.g., networking equipment), or liquid cooling systems (e.g., refrigeration systems). Connectors 114 may include a variety of components including, but not limited to, connection interfaces, cables, tubing, piping, housing, supports or framing, and other components configured to deliver or support delivering utilities or functionalities to racks 110.

As mentioned above, in some examples, one or more connectors 114 of rack section 102 may be configured to supply cooling fluid to a respective rack 110 positioned in a respective rack station 108. In addition or alternative to receiving cooling air from a forced air cooling system, one or more racks 110 of rack section 102 may include cooling devices (not shown) configured to provide additional cooling capacity to a respective rack 110. For example, some computing devices within various racks 110 may produce a greater amount of heat than other computing devices, and thus require a greater amount of cooling. As another example, a particular tenant of a data center may have different cooling requirements for computing devices owned by the tenant. Rather than supply bulk cooling to all computing devices within rack section 102, irrespective of individual heat load or tenant preference, rack stations 108 may be configured to supply a controllable liquid cooling capacity to a respective rack 110. In this way, rack section 102 may enable a higher power density than data center rack systems that do not provide liquid cooling.

In some examples, connector 114 may control a supply of cooling fluid to a particular rack 110 to provide a particular flow rate of cooling fluid to the respective rack 110. In some examples, each connector 114 may include a control valve assembly (not shown) configured to receive a temperature signal from rack 110 positioned in the respective rack station 108. The temperature signal may represent a temperature of a cooling fluid at an inlet or outlet of a cooling device within rack 110, a temperature of one or more computing devices within rack 110, or a temperature of a component or volume within rack 110. The control valve assembly may be configured to control a flow of the cooling fluid to the respective rack station 108 based on the temperature signal from the respective rack 110. For example, the control valve assembly may include a control valve configured to control a flow of cooling fluid to rack 110 and a controller configured to receive the temperatures signal and control the control valve based on the temperature signal.

In some examples, connectors 114 may be quick-connect connectors. A quick-connect connector may include any connector configured to supply or enable or utilities to rack 110 in a connected state, refrain from supplying utilities to rack 110 in a disconnected state, and connect to rack 110 by switching from the unconnected state to the connected state using a relatively simple mechanism (e.g., push connect, twist connect, etc.). For example, connectors 114 may include various structural features that interface with a connection panel of each rack 110 to quickly allow connectors 114 to be connected and disconnected from racks 110.

In some examples, connector 114 may be flexible. For example, connectors 114 may be configured to move a distance away from their respective rack stations 108, such that connectors 114 may be connected to a respective rack 110 corresponding to a rack station 108 while rack 110 is positioned partially or fully withdrawn from the respective rack station 108. In this way, connectors 114 may permit racks 110 to move within rack section 102 without disconnecting connectors 114 or permit racks 110 to be coupled to utilities through connectors 114 prior to positioning racks 110 in rack stations 108. Such a flexible configuration may further limit an amount of space for performing installation, removal, or setup of racks 110 or computing devices within racks 110. In some examples, connector 114 may be configured to couple to different areas of racks 110, such that racks 110 having a variety of connection configurations may be accommodated within a respective rack station 108. For example, connectors 114 may couple to a front of rack 110, a rear of rack 110, a top of rack 110, or any other portion of racks 110.

Figure 1B:
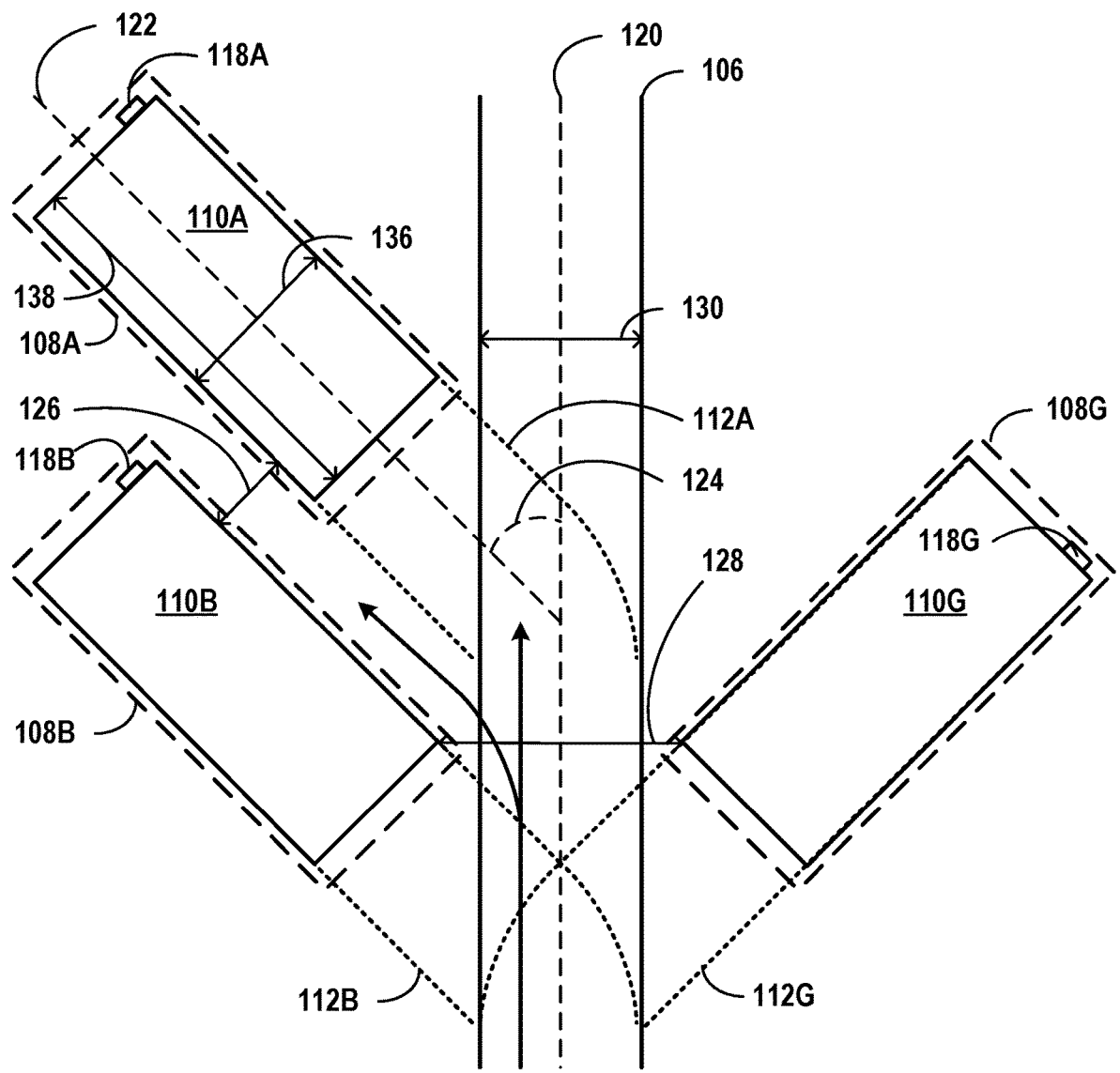
FIG. 1B is a conceptual diagram illustrating a top view of example rack stations for positioning racks in a data center rack system, in accordance with one or more aspects of the present disclosure.
Figure 1C:
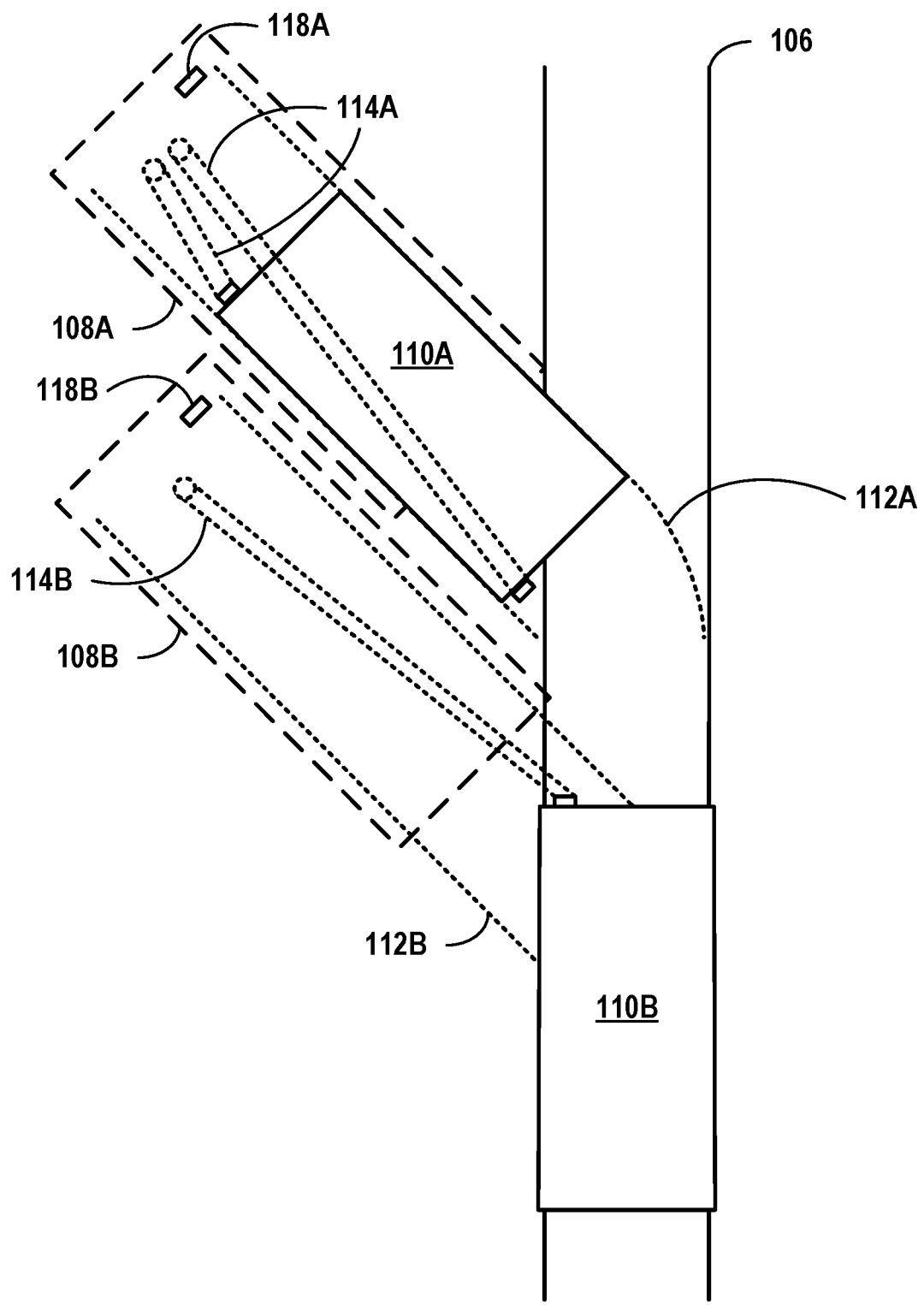
FIG. 1C is a conceptual diagram illustrating a top view of example intermediate positions for positioning racks in a data center rack system, in accordance with one or more aspects of the present disclosure.

In some examples, connector 114 may be configured to couple to rack 110 from above rack 110. As explained above, racks 110 may receive cooling air at one or more surfaces of racks 110, such as front and/or lateral sides of racks 110, while receiving guidance along a bottom of racks 110 from aisle guidance track 106 and/or station guidance tracks 112. As such, a space above racks 110 may be relatively free of equipment, thus allowing a high amount of flexibility for positioning and/or attaching connectors 114. By locating connectors 114 above racks 110, data center rack system 100 may permit connectors 114 to be attached and removed relatively easily from racks 110. For example, when installing rack 110A, a technician may position rack 110A in an intermediate position near rack station 108A (such as illustrated in FIG. 1C below) and connect connector 114A to rack 110A. Once connector 114A is connected to rack 110A, the technician may position and secure rack 110A into rack station 108A.

A position and/or orientation of racks stations 108 within rack section 102 may allow rack section 102 to have various sizing and/or cooling characteristics. FIG. 1B is a conceptual diagram illustrating example rack stations 108 for positioning racks 110 in a data center rack system, in accordance with one or more aspects of the present disclosure. FIG. 1B is illustrated with respect to rack stations 108A, 108B, and 108G of rack section 102 of FIG. 1A. Each rack station 108 may be configured to position a rack 110 having a width 136 and a length 138. In some examples, each rack station 108 may be configured to position a rack 110 having width 136 between about 20 inches and about 32 inches and length 138 between about 40 inches and about 60 inches.

In some examples, each rack station 108 within a row of rack stations 108 (e.g., rack station 108A) may be positioned to space racks 110 (e.g., rack 110A) a spacing distance 126 from adjacent racks 110 (e.g., rack 110B) positioned within the row of rack stations 108 (e.g., rack station 108B). Spacing adjacent racks 110 at spacing distance 126 may create a cooling gap between the adjacent racks 110 that may permit cooling air flowing down aisle 104 to flow between the adjacent racks 110. Spacing distance 126 may be selected based on a variety of factors including, but not limited to, flow rate of cooling air through rack section 102, flow rate of cooling air through aisle 104, dimensions of rack section 102, heat load of racks 110, availability of liquid cooling, and the like. For example, as spacing distance 126 increases, a flow and/or turbulence of cooling air along racks 110 may increase, increasing a cooling rate to racks 110. As another example, availability of liquid cooling to racks 110 may reduce a heat load to be removed from racks 110 by cooling air and, correspondingly, an amount of cooling air to racks 110, such that spacing distance 126 may be reduced. In some examples, a minimum distance of spacing distance 126 between adjacent rack stations 108 may be at least 1 inch.

Aisle guidance track 106 defines an aisle axis 120. Aisle axis 120 represents a direction of orientation of rack 110 during transportation of rack 110 along aisle 104. As such, aisle guidance track 106 may be configured to position rack 110 along aisle axis 120 while directing rack 110. Each station guidance track 112 defines a station axis 122. Station axis 122 represents a direction of orientation of rack 110 once rack 110 is positioned in a respective rack station 108. As such, each station guidance track 112 is configured to position rack 110 along station axis 122 once rack 110 is positioned within rack station 108.

Each rack station 108 may be configured to position a respective rack 110 in the respective rack station 108 at a rack angle 124 formed between aisle axis 120 and station axis 122. To permit a more customizable footprint of rack section 102, rack angle 124 is non-normal (less than 90 degrees). In some examples, rack angle 124 is between about 45 degrees and about 65 degrees. In some examples, rack angle 124 is about 50 degrees or about 55 degrees. For example, a rack section 102 that has a footprint of 20 feet by 12 feet may fit two rows of five rack stations 108 each at 55 degrees.

Rack angle 124 may be selected based on a variety of factors. In some examples, rack angle 124 may be selected based on a desired x-dimension 132 and/or y-dimension 134 of a footprint of rack section 102. X-dimension 132 of rack section 102 may be related to an x-dimension of each row of racks 110 and a width of aisle 104 to remove each rack 110. Similarly, y-dimension 134 of rack section 102 may be related to the y-dimension of each row. For racks 110 having a greater length 138 than width 136, as rack angle 124 is reduced from 90 degrees, x-dimension 132 of rack section 102 may decrease and y-dimension 134 of rack section 102 may increase.

In some examples, racks 110 positioned in rows at rack angles 124 may be capable of fitting in dimensionally constrained rack sections 102. In some examples, rack sections 102 may be dimensionally constrained due to a physical or imaginary (e.g., legal or commercial) boundary of rack section 102. For example, rack section 102 may be sized to permit prefabrication and subsequent road transportation of rack section 102. In other examples, rack sections 102 may be dimensionally constrained due to a plurality of rack sections 102 sized to fit into a dimensionally constrained data center room. For example, rack section 102 may be sized to balance a total number of rows of rack stations 108 (e.g., total x-dimension of rack sections) with a total number of racks per row of rack stations 108 (e.g., total y-dimension of rack sections), such that a greater number of racks may fit into data center room than in a perpendicular rack configuration.

In some examples, each rack station 108 within a first row of rack stations 108 (e.g., rack station 108B) may be positioned to space racks 110 (e.g., rack 110B) a spacing distance 128 from an opposing rack 110 (e.g., rack 110G) within the second row of rack stations 108 (e.g., rack station 108G). Alternatively, in examples in which a rack section includes a single row of rack stations 108, each rack station 108 within the single row of rack stations 108 may be positioned to space racks 110 the spacing distance from an opposing structure, such as a boundary (e.g., a wall or cage) or racks 110 from another rack section. For example, spacing opposing racks 110, or a rack 110 and a wall, at spacing distance 128 may create a positioning gap that may allow racks 110 transported down aisle 104, such as on aisle guidance track 106, to pivot and turn into a corresponding rack station 108, such as into a respective station guidance track 112. As another example, spacing opposing racks 110, or a rack 110 and a wall, at spacing distance 128 may create a cooling gap that may allow cooling air flowing down aisle 104 to flow at a sufficient flow rate. Spacing distance 128 may be selected based on a variety of factors including, but not limited to, dimensions (e.g., length and/or width) of rack 110, spacing distance 126 between adjacent rack stations 108, rack angle 124, dimensions of rack section 102, heat load of racks 110, availability of liquid cooling, and the like. For example, as rack angle 124 increases, spacing distance 128 may increase to provide sufficient clearance for installation of rack 110 into and/or removal of rack 110 from rack station 108. In some examples, a minimum distance of spacing distance 128 between opposing rack stations may be at least 28 inches.

In some examples, aisle guidance track 106 and each station guidance track 112 may include at least two tracks having a separation distance 130. Separation distance 130 may represent a distance between outermost tracks of aisle guidance track 106. Separation distance 130 may be selected based on a variety of factors including, but not limited to, dimensions (e.g., length and/or width) of rack 110, spacing distance 126 between adjacent rack stations 108, rack angle 124, dimensions of rack section 102, heat load of racks 110, availability of liquid cooling, and the like. In some examples, a maximum distance of separation distance 130 may be 30 inches.

In some examples, each rack station 108 may include one or more anchoring mechanisms 118 (referred to individually as "anchoring mechanism 118" and collectively as "anchoring mechanisms 118"). Anchoring mechanism 118 is configured to secure the respective rack 110 at the respective rack station 108. Anchoring mechanism 118, when in an anchoring state, may secure the respective rack 110 at the respective rack station by providing an active or bounding force that is sufficient to contain rack 110 within a respective rack station 108. In some examples, anchoring mechanism 118 is configured to interface with a corresponding anchoring mechanism (not shown) of rack 110. A variety of anchoring mechanisms 118 may be used including, but not limited to, depressions, locking features, hooking features, and the like. In some examples, rack station 108 may not include anchoring mechanism 118; rather, an anchoring mechanism may be located solely on rack 110.

In some examples, anchoring mechanism 118 may be part of or adjacent to a respective station guidance track 112. For example, in examples in which station guidance track 112 includes an elongated depression in a floor, station guidance track 112 may include a second depression in the floor that is deeper and/or discrete from the elongated depression, such that the second depression is configured to receive a wheel of the corresponding rack 110 and secure rack 110 into position within rack station 108.

Data center rack systems discussed herein may be configured to permit intermediate positions of racks within rack sections. FIG. 1C is a conceptual diagram illustrating a top view of example intermediate positions for positioning racks in a data center rack system, in accordance with one or more aspects of the present disclosure. As an example, a customer may wish for a rack to remain within a rack section for security, remain connected to various equipment within the rack section for testing or connectivity, or remain within a rack section for faster access. Rather than completely remove the rack from the rack section for maintenance, the rack may be repositioned within the respective rack section so that maintenance may be performed on various portions of the rack that may be more difficult to access when the rack is positioned in a rack station, such as physical structures of the rack or computing devices within the rack.

In the example of FIG. 1C, rack 110A is shown partially withdrawn from rack station 108A to an intermediate position between rack station 108A and aisle 104. In this partially withdrawn position, portions of rack 110A, such as a side or top, may be accessed without removing rack 110A completely from rack station 108A. For example, when installing rack 110A, a technician may position rack 110A to the partially withdrawn position near rack station 108A and connect connectors 114A to rack 110A. In the example of FIG. 1C, rack station 108A includes two connectors 114A in which a first connector is coupled to a front of rack 110A and a second connector is coupled to a back of rack 110A. Once connectors 114A are connected to rack 110A, the technician may position and secure rack 110A into rack station 108A with anchoring mechanism 118A.

Also in the example of FIG. 1C, rack 110B is shown fully withdrawn from rack station 108B into aisle 104. From this fully withdrawn position, portions of rack 110B, such as a side or rear, may be accessed without removing rack 110B from rack section 102. For example, when performing maintenance on a rear of rack 110B, a technician may position rack 110A to the fully withdrawn position in aisle 104 and access the rear of rack 110B.

The partially withdrawn position of rack 110A or fully withdrawn position of rack 110B may enable racks 110A or 110B to remain connected to a corresponding connector 114A or 114B during maintenance. For example, as explained above, connectors, such as connectors 114A and 114B, may be flexible and/or accessed from above racks 110A or 110B, such that connectors 114A or 114B may be configured to move a distance away from their respective rack stations 108A or 108B. As such, racks 110A or 110B may be moved from a respective rack station 108A or 108B without disconnecting a respective rack 110A or 110B or connected to a respective connector 114A or 114B prior to positioning rack 110A or 110B within a respective rack station 108A or 108B.

Figure 1D:
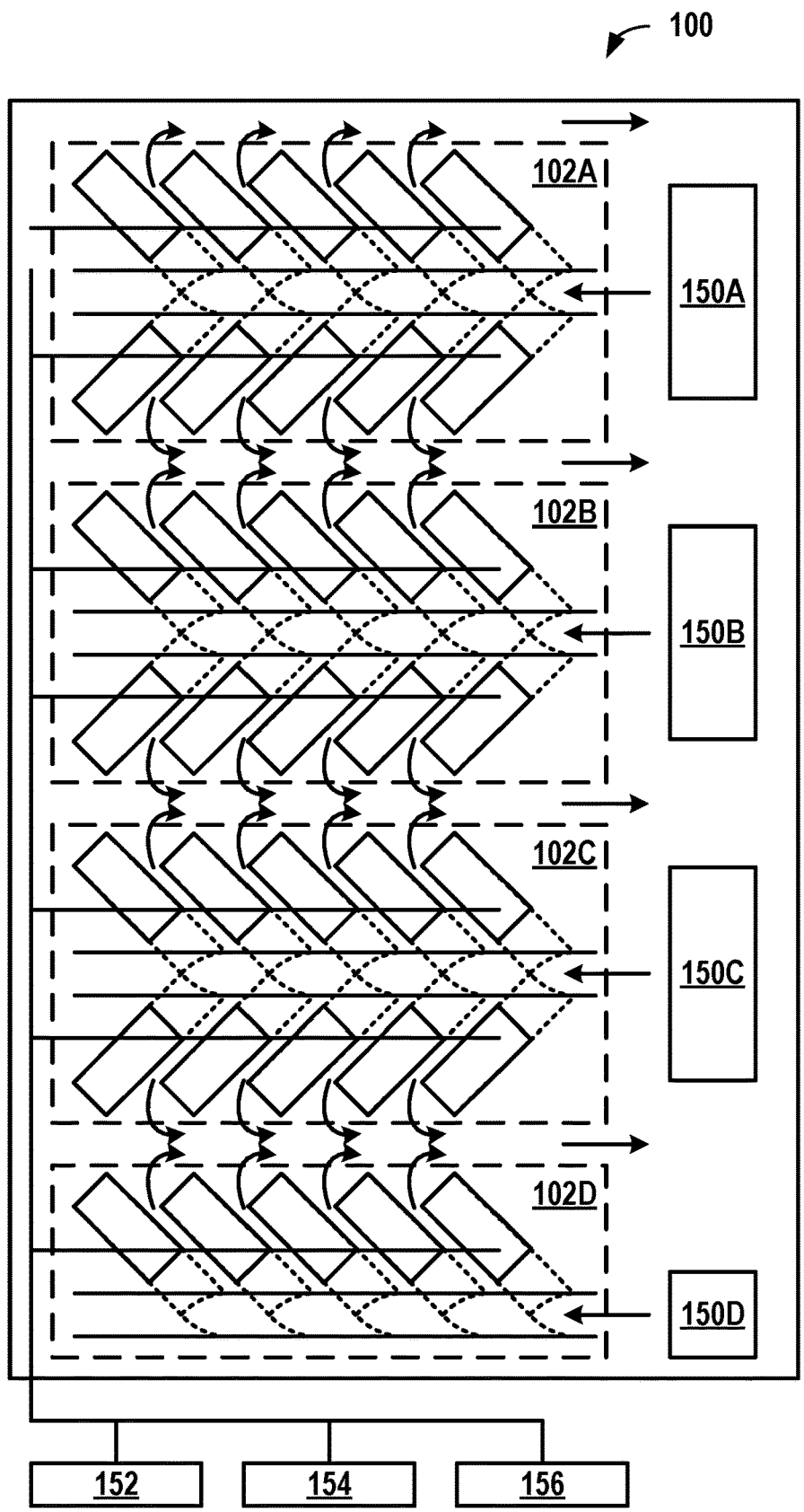
FIG. 1D is a conceptual diagram illustrating a top view of an example data center rack system that includes multiple aisles and cooling infrastructure, in accordance with one or more aspects of the present disclosure.

Data center rack systems discussed herein may include one or more rack sections configured to receive cooling from one or more cooling systems. FIG. 1D is a conceptual diagram illustrating an example data center rack system 100 that includes multiple rack sections 102A, 102B, 102C, and 102D (collectively, "rack sections 102"), in accordance with one or more aspects of the present disclosure. As illustrated, rack sections 102A, 102B, and 102C include two rows of racks with an aisle bounded by the two rows of racks, while rack 102D includes a single row or racks with an aisle bounded by the single row of racks and a boundary of data center rack system 100.

Rack sections 102 may be housed in a data center. The data center may include a storage volume that stores rack section 102. The data center may be situated in a stand-alone building used primarily or exclusively for the data center, or may be situated in a portion of a larger building used for other uses including office space, residential space, retail space or any other suitable use. The data center may be in an urban, suburban, or rural location or any other suitable location with any suitable climate. The data center may provide an operating environment for co-location, interconnection, and/or other services. For example, data center 100 may provide an operating environment for any number of services that may be categorized according to service types, which may include, for example, applications/software, platforms, infrastructure, virtualization, and servers and data storage.

In some examples, data center rack system 100 includes one or more forced air cooling systems 150A, 150B, and 150C (referred to individually as "forced air cooling system 150" and collectively as "forced air cooling systems 150"). In the example of FIG. 1D, each forced air cooling system 150A, 150B, 150C, and 150D corresponds to a respective rack section 102A, 102B, 102C, 102D; however, in other examples; however, greater or fewer forced air cooling system 150 may be used. For example, a single forced air cooling system 150 may be used for a data center room to provide bulk cooling to rack sections 102 within the data center room.

Each forced air cooling system 150 may be configured to supply cooling air to the plurality of rack stations (not labeled) within rack sections 102. Forced air cooling system 150 may receive intake air, optionally cool the intake air, and supply the cooling air to the storage volume of the data center. For example, as indicated in FIG. 1D, cooling air may flow down an aisle (not labeled) and between racks (not labeled) of each rack section 102 to provide cooling air to the racks. Exhaust air is released from computing devices of the racks and recirculated by forced air cooling system 150. While the exhaust air is illustrated as returning down a lateral aisle between adjacent rack sections, exhaust air may follow any flow path after cooling the racks, such as above the racks (e.g., via a ceiling plenum or ducting), below a floor beneath the racks (e.g., via a floor plenum), behind the racks, and the like. Forced air cooling system 150 may include any cooling system capable of supplying air to the racks of rack sections 102 to remove heat from computing devices of the racks of rack sections 102. Forced air cooling systems 150 may include a variety of components including, but not limited to, fans, refrigeration systems, heat sinks, and the like. Forced air cooling systems 150 may be sized based on heat load of racks 110 of rack sections 102. For example, each air cooling system 150 may be configured to supply greater than 28 KW of cooling for each rack 110 of rack section 102. Forced air cooling systems 150A, 150B, 150C, and 150D, may be located in various locations—overhead over the aisles, on any of the walls or doors within the data center, and the number of systems provided may vary depending on cooling, redundancy, elimination of dead air pockets or high velocity areas, etc.

In some examples, data center rack system 100 includes a liquid cooling system 152 configured to remove heat from racks 110 of rack sections 102 using a cooling liquid. Liquid cooling system 152 may form a cooling circuit with racks 110 to remove heat from computing devices of racks 110. Liquid cooling system 152 may be configured to receive cooling fluid from racks 110 of rack sections 102, remove heat from the cooling fluid, and discharge cooled cooling fluid to racks 110. Liquid cooling system 152 may include a variety of components including, but not limited to, piping to form the cooling circuit with racks 110, heat exchangers for removing heat from the computing devices of racks 110 and/or cooling fluid, one or more pumps for pumping cooling fluid through the piping, racks 110, connectors 114, and/or heat exchangers, and the like. Liquid cooling system 152 may be sized based on heat load of racks 110 of rack sections 102. For example, liquid cooling system 152 may be configured to supply greater than 44 KW of cooling for each rack 110 of rack section 102.

In some examples, each forced air cooling system 150 may be configured to provide a baseline level of cooling to a respective rack section 102. For example, in the event that liquid cooling system 152 may be inoperable, forced air cooling system 150 may the baseline level of cooling to racks within rack sections 102 to maintain a temperature of racks 110 below a threshold temperature for a particular amount of time or for a particular level of performance. In some examples, forced air cooling systems 150 may be configured to maintain a relatively uniform bulk temperature within a data center room that includes multiple rack sections 102. For example, one or more forced air cooling systems 150 may maintain sufficiently high and/or turbulent flow through rack sections 102 that air within the data center room may be, for example, within 5 degrees.

In some examples, each forced air cooling system 150 may be configured, alone or in combination, to operate according to various control settings for providing different levels and/or types of cooling. In some examples, each forced air cooling system 150 may be configured with a low flow setting to introduce fresh air (e.g., filtered outside air) for pressurization of a data center room in which data center rack system 100 is contained, such that the data center room receives filtered air that meets, for example, minimum ventilation requirements or specifications. In some examples, each forced air cooling system 150 may be configured with an emergency flow setting to introduce air at high flow rates and prevent or minimize thermal runaways if liquid cooling system 152 or another forced air cooling system 150 fails. For example, the data center room may include equipment such as dampers or louvers configured to exhaust any excess air above a baseline in response to the emergency setting. In some examples, each forced air cooling system 150 may be configured with a compensatory flow setting to introduce air at variable flow rates to compensate for deficiencies in operation of equipment related to racks 110, such as cooling connections or equipment for an individual rack 110.

In some examples, data center rack system 100 may include a data transfer system 154 configured to facilitate transfer of data to and from computing devices in racks 110 of rack sections 102. In some examples, data transfer system 154 may be configured to transfer data between computing devices in racks 110 in different rack sections 102. For example, data transfer system 154 may provision a connection, such as a physical interconnect or a network connection, to transfer data between a first rack 110 in a first rack section 102 owned by a first tenant and a second rack 110 in a second rack section 102 owned by a second tenant.

In some examples, data center rack system 100 may include an electrical power system 156 configured to supply electrical power to components of data center rack system 100, such as racks 110 of rack sections 102, forced air cooling systems 150, liquid cooling system 152, and/or data transfer system 154. In some example, electrical power system 156 may include power storage that may be modularly scalable. For example, electrical power system 156 may be configured to continue to supply power in the event of power loss through power storage, such as batteries. In these examples, electrical power system 156 may include power storage that is scalable according to power requirements of an individual or group of rack sections 102.

FIG. 2A is a conceptual diagram illustrating a front perspective view of an example data center rack 200, in accordance with one or more aspects of the present disclosure, while FIG. 2B is a conceptual diagram illustrating a rear perspective view of example data center rack 200 of FIG. 2A, in accordance with one or more aspects of the present disclosure. Rack 200 may correspond to racks 110 of FIGS. 1A-1D. Each rack 200 may include a frame 202. Frame 202 defines a rack volume. Frame 202 may be configured to house one or more computing devices 201.

In some examples, each rack 200 includes a dolly 203 configured to couple to frame 202. Dolly 203 may be configured to provide various functionalities to rack 200, such as transportation (e.g., via a transportation mechanism), guidance (e.g., via a guidance mechanism), anchoring (e.g., via an anchoring mechanism), security, or other functionalities that may be associated with an interface between rack 200 and a rack station (e.g. rack station 108). In some examples, dolly 203 may be configured to be modular and/or universal. For example, dolly 203 may secure to a standardized size, shape, or other specification of frame 202. In some examples, dolly 203 may have a relatively low profile (e.g., fit entirely beneath rack 200 and/or within a footprint of a rack station).

In some examples, each rack 200 includes a transportation mechanism coupled to frame 202. The transportation mechanism may include any transportation mechanism configured to permit movement of rack 200. In the example of FIGS. 2A and 2B, the transportation mechanism includes a set of wheels 204; however, the transportation mechanism may include any suitable mechanism including rolling mechanisms, such as wheels and rollers; conveyer mechanisms, such as tracks and overhead connectors; or any other mechanism capable of allowing movement of rack 200 in response to an applied force intended for moving rack 200.

Each rack 200 includes a guidance mechanism coupled to frame 202. The guidance mechanism may include any guidance mechanism configured to engage aisle guidance track 106 and a respective station guidance track 112. Guidance mechanisms that may be used include, but are not limited to, projections, such as tracks and rails; depressions, such as grooves and cavities; and the like. In the example of FIGS. 2A and 2B, the guidance mechanism includes a set of wheels 204. For example, in examples in which aisle guidance track 106 and/or station guidance track 112 includes raised projections, wheels 204 may be spaced to fit between or around the projections. As another example, in examples in which aisle guidance track 106 and/or station guidance track 112 includes depressions, wheels 204 may be configured to fit within the depressions. In the example of FIGS. 2A and 2B, wheels 204 may also function as a transportation mechanism; however, in other examples, a transportation mechanism may be separate from a guidance mechanism.

Each rack 200 includes an anchoring mechanism coupled to frame 202. The anchoring mechanism may include any anchoring mechanism configured to anchor rack 200 at the respective rack station 108. In the example of FIGS. 2A and 2B, the anchoring mechanism includes wheel locks 206 configured to lock wheels 204 to restrict movement of rack 200; however, the anchoring mechanism may include any suitable mechanism including mechanisms that interface with the transportation mechanism of rack 200, such as wheel locks; mechanisms that interface with the guidance mechanism of the respective rack station 108, such as second lower depressions in station guidance track 112; mechanisms that interface with a support located at a respective rack station 108, such as anchoring mechanism 118 of FIG. 1B; or any other mechanism capable of restricting movement of rack 200.

In some examples, rack 200 includes a connection panel 208 coupled to frame 202. Connection panel 208 may be configured to receive the respective connector 114 at a respective rack station 108. In the example of FIGS. 2A and 2B, connection panel 208 includes an electrical connection, a cooling fluid inlet 214A, and a cooling fluid outlet 214B.

In some examples, rack 200 includes one or more cooling mechanisms configured to cool rack 200. For example, rack 200 may include a rear door 210 configured house cooling equipment and open away from aisle 104 for servicing the cooling equipment. In some examples, each rear door 210 may include one or more heat exchangers 216A configured to receive cooling fluid and/or one or more fans 216B configured to draw air through heat exchanger 216A into the rack volume. In such examples, connection panel 208 may be configured to receive cooling fluid into heat exchanger 216A using cooling fluid inlet 214A and discharge the cooling fluid from heat exchanger 216A using cooling fluid outlet 214B. Fans 216B may be configured to flow air over heat exchanger 216A to provide cooled air to computing devices of rack 200. In some examples, rack 200 may provide liquid cooling that is more localized than rack-level cooling, such as chip-level cooling or server-level cooling. A variety of liquid cooling systems may be used including, but not limited to, one-phase cooling systems, two-phase cooling systems, water-based cooling systems, dielectric-based cooling systems, or any other cooling system that may provide localized liquid cooling to any of rack 200 or computing devices 201.

In some examples, a controller (not shown) of rack 200 may be configured for different cooling configurations. For example, in a first mode, the controller may be configured to control heat exchanger 216A in an "off" state (e.g. control a control valve to prevent flow of cooling fluid through heat exchanger 216A) and fans 216B in an "off" state (e.g., control a switch to prevent operation of fans 216B), such that cooling is provided to rack 200 from a forced air cooling system, such as forced air cooling systems 150 of FIG. 1D. In a second mode, the controller may be configured to control heat exchanger 216A in an "off" state and fans 216B in an "on" state, such that increased cooling is provided to rack 200 from the forced air cooling system and fans 216B. In a third mode, the controller may be configured to control heat exchanger 216A in an "on" state and fans 216B in an "on" state, such that further increased cooling is provided to rack 200 from the forced air cooling system, fans 216B, and heat exchanger 216A.

Figure 3A:
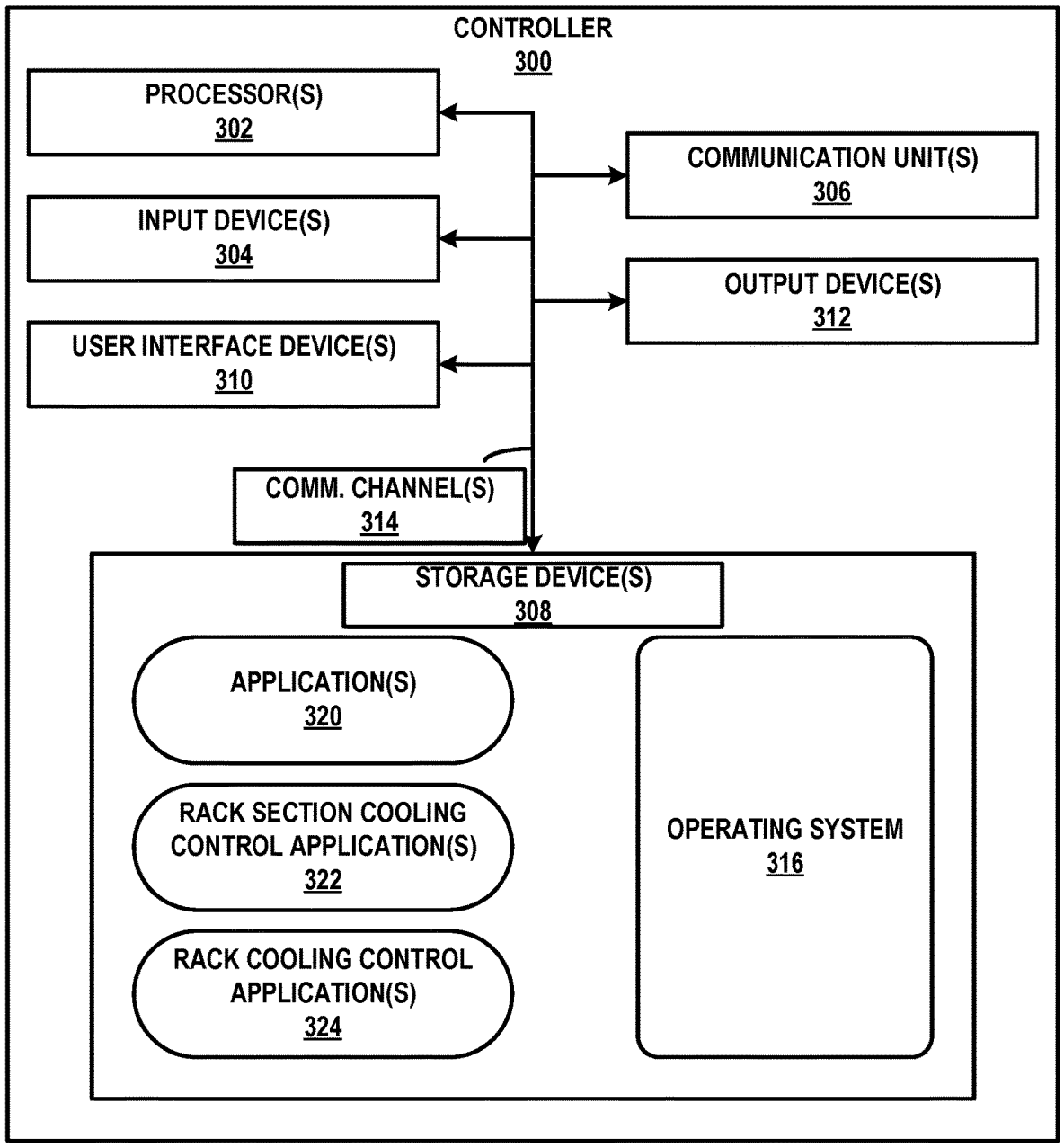
FIG. 3A is a block diagram illustrating an example controller configured to control cooling for a rack within a rack section, in accordance with one or more aspects of the present disclosure.

Data center rack systems discussed herein may be configured to cool racks using a special purpose computing device, such as a controller. FIG. 3A is a block diagram illustrating an example controller 300 configured to control cooling for a rack within a rack section, such as rack 110 within rack section 102. Controller 202 may include a server or other computing device that includes one or more processor(s) 802 for executing rack section cooling control application 322 and rack cooling control application 324, although controller 300 may be leveraged for other purposes in data center rack system 100 as well. Although shown in FIG. 3A as a stand-alone controller 300 for purposes of example, a computing device may be any component or system that includes one or more processors or other suitable computing environment for executing software instructions.

As shown in FIG. 3A, controller 300 includes one or more processors 302, one or more input devices 304, one or more communication units 306, one or more output devices 312, one or more storage devices 308, one or more user interface (UI) device2 310, and communication unit 306. Controller 300 includes one or more applications 322, rack section cooling control application 322, rack cooling control application 324, and operating system 316 that are executable by controller 300. Each of components 302, 304, 306, 308, 310, and 312 are coupled operatively for inter-component communications. In some examples, communication channels 314 may include a system bus, a network connection, an inter-process communication data structure, or any other method for communicating data. Communication may be via one or more communication protocols including Mod-Bus, BacNET, proprietary DDC or PLC manufacturer's protocol, PCI, or an open protocol. Controller 300 may be located and execute, for example, within a data center of data center rack system 100 or at another location.

Processors 302 may be configured to implement functionality and/or process instructions for execution within controller 300, such as instructions stored in storage device 308. Examples of processors 302 may include, any one or more of a microprocessor, a controller, a digital signal processor (DSP), an application specific integrated circuit (ASIC), a field-programmable gate array (FPGA), or equivalent discrete or integrated logic circuitry.

One or more storage devices 308 may be configured to store information within controller 300 during operation. Storage device 308, in some examples, is described as a (non-transitory) computer-readable storage medium. In some examples, storage device 308 is a temporary memory, meaning that a primary purpose of storage device 308 is not long-term storage. Storage device 308, in some examples, includes volatile memory, meaning that storage device 308 does not maintain stored contents when the computer is turned off. Examples of volatile memories include random access memories (RAM), dynamic random-access memories (DRAM), static random-access memories (SRAM), and other forms of volatile memories known in the art. In some examples, storage device 308 is used to store program instructions for execution by processors 302. Storage device 308 in one example, is used by software or applications running on controller 302 to temporarily store information during program execution. Storage devices 308 may further be configured for long-term storage of information. In some examples, storage devices 308 include non-volatile storage elements. Examples of such non-volatile storage elements include magnetic hard discs, optical discs, floppy disks, Flash memories, or forms of electrically programmable memories (EPROM) or electrically erasable and programmable (EEPROM) memories.

Controller 300, in some examples, also includes one or more communication units 306. Controller 300, in one example, utilizes communication units 306 to communicate with external devices via one or more networks, such as one or more wired/wireless/mobile networks, etc. Communication units 306 may include a network interface card, such as an Ethernet card, an optical transceiver, a radio frequency transceiver, or any other type of device that can send and receive information. Other examples of such network interfaces may include 3G, 4G and Wi-Fi radios.

In some examples, controller 300 may use communication unit 306 to communicate with one or more devices of data center rack system 100 configured to provide cooling to racks 110 of data center rack system 100. For example, communication unit 306 may be communicatively coupled to racks 110, connectors 114, forced air cooling system 150, and/or liquid cooling system 152 and configured to receive measurements from components of data center rack system 100 and send control signals to components of data center rack system 100. For example, communication unit 306 may receive air temperature and/or flow rate measurements from racks 110 and/or forced air cooling system 150; liquid temperature and/or flow rate measurements from connectors 114 and/or liquid cooling system 152; and the like; As another example, communication unit 306 may send control signals to liquid cooling control valves to control the flow of liquid cooling to racks 110, send control signals to fans 216A of racks 110 to control a flow of air over heat exchangers 216A; send control signals to fans of air cooling system 150 to control flow of cooling air into rack section 102; and the like.

In some examples, controller 300 may use communication unit 306 to communicate with an external device, such as a controller for forced air cooling system 150, liquid cooling system 152, data transfer system 154 and/or electrical power system 156. In some examples, communication unit(s) 306 and input device(s) 304 may be operatively coupled to controller 300. For example, controller 300 may receive a communication from an analog input device indicating an amperage, voltage, or other signal at the input device. Depending on implementation, digital signaling techniques, analog signaling techniques, or any combination thereof, may be used by controller 300 for the purpose of controlling a flow rate of cooling air or liquid cooling to one or more racks 110 of data center rack system 100, in accordance with the disclosure.

Controller 300 may include one or more user interface devices 310. User interface devices 310 may be configured to receive input from a user through tactile, audio, or video feedback. Examples of user interface devices(s) 310 include a presence-sensitive display, a mouse, a keyboard, a voice responsive system, video camera, microphone or any other type of device for detecting a command from a user. In some examples, a presence-sensitive display includes a touch-sensitive screen.

One or more output devices 312 may also be included in controller 202. Output device 312, in some examples, is configured to provide output to a user using tactile, audio, or video stimuli. Output device 312, in one example, includes a presence-sensitive display, a sound card, a video graphics adapter card, or any other type of device for converting a signal into an appropriate form understandable to humans or machines. Additional examples of output device 312 include a speaker, a liquid crystal display (LCD), or any other type of device that can generate intelligible output to a user.

Controller 300 may include operating system 316. Operating system 316, in some examples, controls the operation of components of controller 300. For example, operating system 316, in one example, facilitates the communication of one or more applications 320, rack section cooling control application 822, and rack cooling control application 824 with processors 302, communication unit 306, storage device 308, input device 304, user interface devices 310, and output device 312.

Application 322, rack section cooling control application 322, and rack cooling control application 324 may also include program instructions and/or data that are executable by controller 300. Rack section cooling control application 322 and rack cooling control application 324 may include instructions for causing a special-purpose computing device to perform one or more of the operations and actions described in the present disclosure with respect to controller 300.

As one example, rack section cooling control application 322 may include instructions that cause processor(s) 302 of controller 300, equivalently controller 300 itself, to control cooling to racks 110 of rack section 102. For example, rack section cooling control application 322 may be configured to control forced air cooling system 150 to control a temperature and/or flow rate of cooling air to rack section 102. Rack section cooling control application 322 may be configured to receive temperature measurements, or measurements of variables related to a temperature or degree of cooling, from racks 110 of rack section 102 and control a flow of cooling air to maintain the individual or average temperatures of racks 110 below a threshold.

As another example, rack cooling control application 324 may include instructions that cause processor(s) 302 of controller 300, equivalently controller 300 itself, to control cooling to an individual rack 110 of rack section 102. For example, rack cooling control application 324 may be configured to control a control valve fluidically coupled to liquid cooling system 152 to control a temperature and/or flow rate of cooling liquid to the respective rack 110. Rack cooling control application 324 may be configured to receive temperature measurements, or measurements of variables related to a temperature or degree of cooling, from racks 110 of rack section 102 and control a flow of cooling liquid to maintain the individual temperature of each rack 110 below a threshold.

Figure 3B:
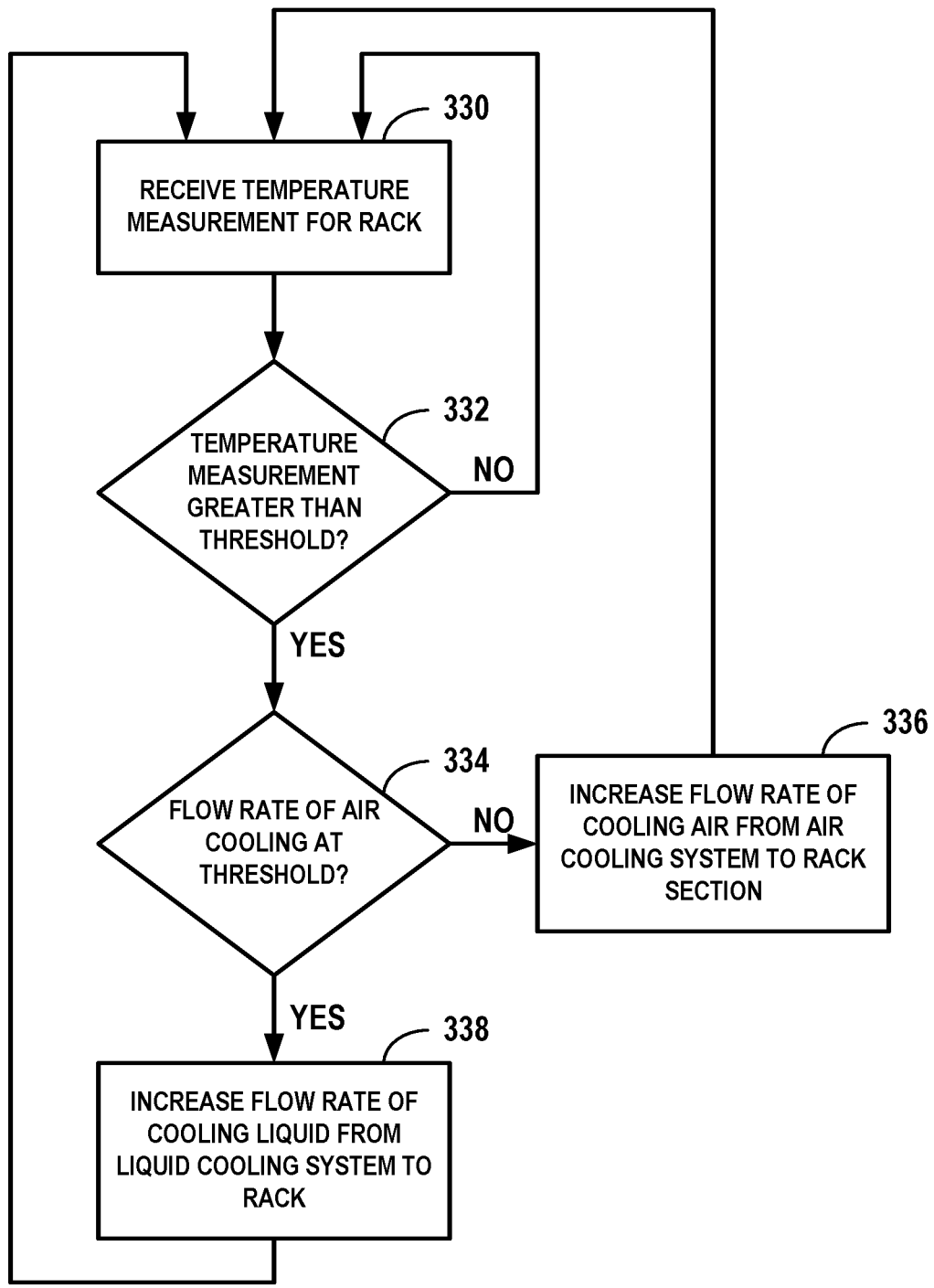
FIG. 3B is a flow diagram of an example technique for controlling cooling for a rack within a rack section, in accordance with one or more aspects of the present disclosure.

Controller 300 may be configured to maintain a temperature of racks 110 or rack section 102 of racks 110 below a temperature threshold. FIG. 3B is a flow diagram of an example technique for controlling cooling of a rack. FIG. 3B will be described with respect to data center rack system 100 of FIGS. 1A-1D, rack 200 of FIGS. 2A-2B, and controller 300 of FIG. 3A; however, in other examples, other data center rack systems, racks, and controllers may be used to implement the techniques of FIG. 3B. Controller 300 may receive a temperature measurement for a respective rack 110 (330). For example, controller 300 may receive the temperature measurement from a temperature sensor in rack 110. Controller 300 may determine whether the temperature measurement for rack 110 exceeds a threshold (332). For example, the threshold may represent a maximum temperature allowed for the respective rack 110. In response to determining that the temperature measurement does not exceed the threshold ("NO"), controller 300 may continue to monitor the temperature of the respective rack 110.

In response to determining that the temperature measurement exceeds the threshold ("YES"), controller 300 may determine whether the flow rate of air cooling is at a threshold (334). For example, the threshold may represent a maximum flow rate of cooling air provided by cooling air system 150 to rack section 102. In response to determining that the flow rate of cooling air is below the threshold ("NO"), controller 300 may increase a flow rate of cooling air from forced air cooling system 150 to rack section 102 to further cool racks 110 and reduce a temperature of the respective rack 110 (336). For example, controller 300 may send a control signal to fans of forced air cooling system 150 to control the fans to increase a flow rate of cooling air to rack section 102.

In response to determining that the flow rate of cooling air is at or above the threshold ("YES"), controller 300 may increase a flow rate of cooling liquid from liquid cooling system 152 to the respective rack 110 and/or a flow rate of cooling air (not shown) to further cool the respective rack 110 and reduce the temperature of the respective rack 110 (338). For example, controller 300 may send a control signal to a control valve of liquid cooling system 152 and/or a control valve of a respective connector 114 to control flow of cooling liquid to heat exchanger 216B of rack 200 and/or send a control signal to a switch of fan 216A of rack 200 to control flow of air over heat exchanger 216B of rack 200.

In some examples, the data center rack systems described herein may be used in conjunction with data centers that include modular units. FIGS. 4A-4E illustrate example data centers assembled from one or more modular units.

Figure 4A:
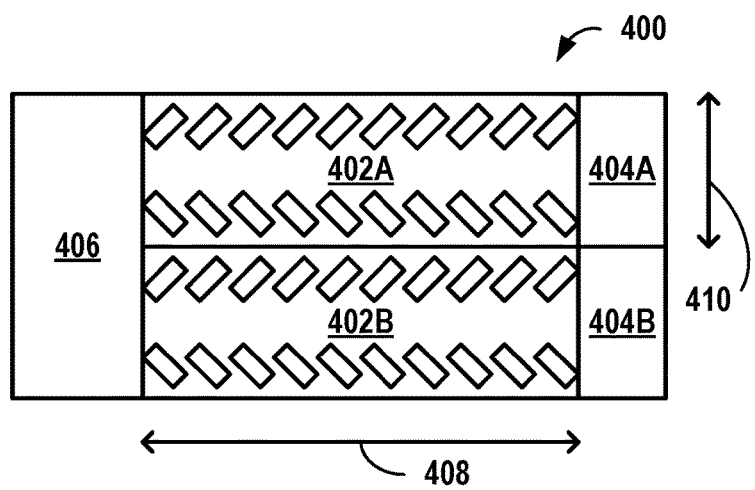
FIG. 4A is a conceptual diagram illustrating a top view of an example modular section of a data center, in accordance with one or more aspects of the present disclosure.

FIG. 4A is a conceptual diagram illustrating a top view of an example modular section 400 of a data center, in accordance with one or more aspects of the present disclosure. Modular section 400 includes two data hall base modules 402A and 402B (referred to individually as "data hall base module 402" and collectively as "data hall base modules 402"). Each data hall base module 402 may be structurally and/or functionally similar to rack sections 102 described in FIGS. 1A-1D. Each data hall base module 402 includes 20 racks; however, more or fewer racks may be housed in data hall base module 402 depending on a y-dimension 408, an x-dimension 410, and a power density of data hall base module 402, among other considerations.

As described with respect to rack sections 102, data hall base modules 402 may represent a modular, pre-fabricated section of modular section 400. For example, each data hall base module 402 may be sized based on dimensional constraints of the data center site and/or a mode of transportation. Data hall base module 402 may include an x-dimension 410 and y-dimension 408 that may correspond to a dimensional limit for road shipping, as discussed above. In some examples, data hall base module 402 may be sized for transport in a shipping container and/or for a footprint of a shipping container. For example, data hall base module 402 may have y-dimension 408 less than or equal to about 40 feet and x-dimension 410 less than or equal to about 14 feet. Such a size of data hall base module 402 may enable data hall base module 402 to be fabricated and assembled overseas in two units (e.g., y-dimension less than or equal to 20 feet and x-dimension less than or equal to 14 feet), transported in a shipping container to a site of the data center, and assembled with other modules to form modular section 400.

Modular section 400 includes two air handling unit (AHU) modules 404A and 404B (referred to individually as "AHU module 404" and collectively as "AHU modules 404") and an electric power module 406. Each AHU module 404 may be structurally and/or functionally similar to forced air cooling systems 150 described in FIGS. 1A-1D. Each AHU module 404 may be sized to provide forced air cooling to a respective data hall base module 402 at relatively high power density. Electric power module 406 may be structurally and/or functionally similar to electrical power system 156 of FIG. 1D. Electric power module 406 may be configured to provide electrical power to data hall base modules 402A and 402B at relatively high density.

Each of AHU modules 404 and electric power module 406 may be sized based on a standard that is relative to other modules 402, 404, and 406 in modular section 400. For example, each of AHU modules 404 may have a capacity of 250 kW and electric power module 406 may have a capacity of 500 kW. Such capacities may support relatively high power density for base modules 402.

Figure 4B:
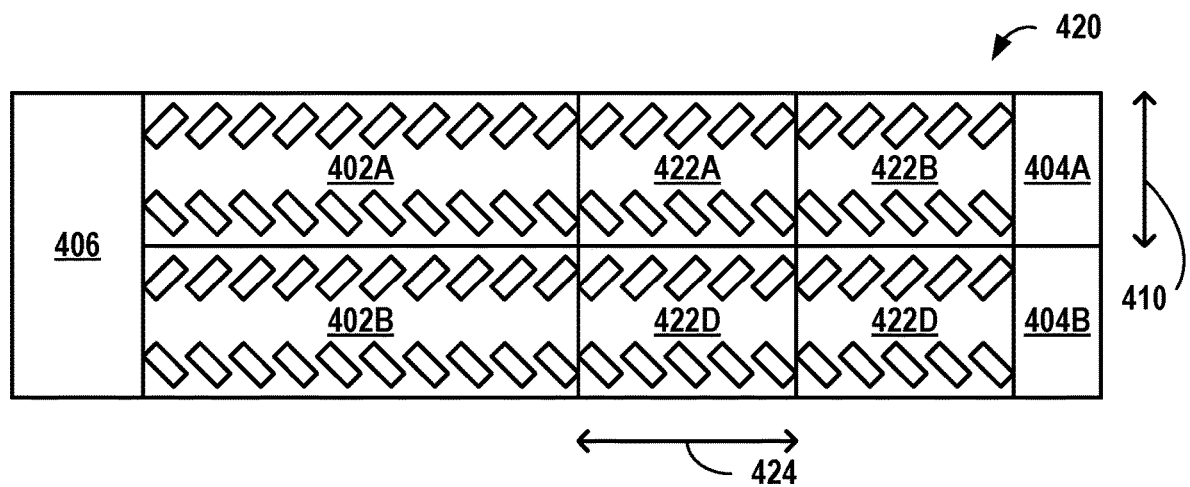
FIG. 4B is a conceptual diagram illustrating a top view of an example modular section of a data center that includes data hall expansion modules, in accordance with one or more aspects of the present disclosure.

In some instances, modular sections of a data hall may be arranged to accommodate lower power densities while maintaining a relatively standard sizing for support modules, such as AHU modules 404 and electric power module 406. FIG. 4B is a conceptual diagram illustrating a top view of an example modular section 420 of a data center that includes data hall expansion modules, in accordance with one or more aspects of the present disclosure. Modular section 420 may include similar modular components as module section 400 of FIG. 4A, including data hall base modules 402A and 402B, AHU modules 404A and 404B, and electric power module 406. However, modular section 420 may also include data hall expansion modules 422A, 422B, 422C, and 422D (referred to individually as "data hall expansion module 422" and collectively as "data hall expansion modules 422"). Data hall expansion modules 422A and 422B extend from data hall base module 402A and data hall expansion modules 422C and 422D extend from data hall base module 402B. AHU modules 404A and 404B may provide forced air cooling to respective data hall base modules 402 and data hall expansion modules 422 at a relatively low power density. Each data hall expansion module 422 includes 10 racks; however, greater or fewer racks may be housed in data hall expansion module 422 depending on a y-dimension 424, an x-dimension 410, and a power density of data hall expansion module 422, among other considerations.

In some examples, data hall expansion modules 422 may be configured to tune a power density of modular section 420. For example, AHU modules 404 and electric power module 406 may be configured to supply up to a particular cooling capacity and power, respectively, to modular section 420. Data hall expansion modules 422 may be configured to increase a footprint and, in some instances, a number of racks in modular section 420, such that modular section may have a reduced areal power density, rack power density, or both.

In some instances (not illustrated in FIG. 4B), data hall expansion modules 422 may reduce an areal power density (i.e., a power per unit area). For example, data hall expansion modules 422 may increase a footprint of data hall modules in modular section 420 while maintaining a same number of racks, such that an areal power density of modular section 420 may be reduced. In such examples, data hall base modules 402 alone may represent a highest areal power density, while a combination of data hall base module 402 and one or more data hall expansion modules 422 may represent a less dense areal power density.

In some instances, such as illustrated in FIG. 4B, data hall expansion modules 422 may reduce a rack power density (i.e., a power per rack). For example, data hall expansion modules 422 may increase a footprint and a corresponding number of racks in modular section 420, while maintaining an amount of electric power from electric power module 406, such that a rack power density of modular section 420 may be reduced. For example, for racks that may not be used for high power applications, such lower rack power density may be sufficient, thereby enabling a greater number of units for modular section 420 (and corresponding services, such as AHU modules 404 and electric power module 406).

As described with respect to data hall base modules 402, data hall expansion modules 422 may represent modular, pre-fabricated sections of modular section 420. For example, each data hall expansion module 422 may be sized based on dimensional constraints of the data center site and/or a mode of transportation. Data hall expansion module 422 may include an x-dimension 424 and y-dimension 410 that may correspond to at least one dimensional limit for road shipping, as discussed above. For example, each data hall expansion module 422 may have a y-dimension 424 that is a fraction of y-dimension 408 of data hall base module 402, such that module section 420 may be expanded in increments. In some examples, each data hall expansion module 422 may be sized for transport in a shipping container and/or for a footprint of a shipping container. For example, data hall expansion module 422 may have y-dimension 424 less than or equal to about 20 feet and x-dimension 408 less than or equal to about 14 feet. Such a size of data hall expansion module 422 may enable data hall expansion module 422 to be fabricated and assembled overseas, transported in a shipping container to a site of the data center and assembled with other modules to form modular section 420.

Figure 4C:
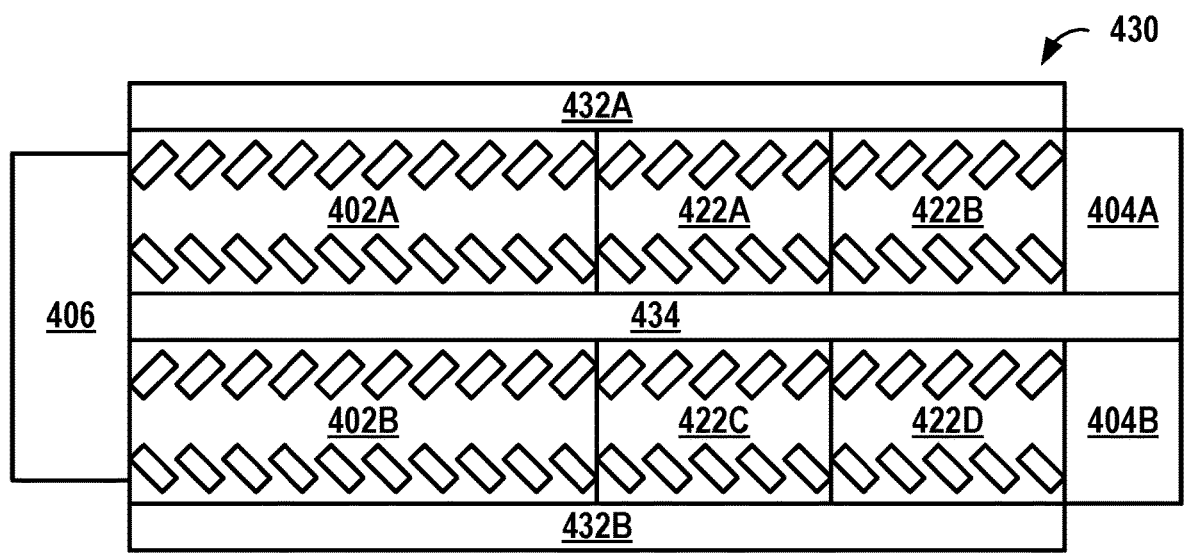
FIG. 4C is a conceptual diagram illustrating a top view of an example modular section of a data hall that includes data hall expansion modules and aisle expansion modules, in accordance with one or more aspects of the present disclosure.

In some instances, modular section of a data hall may further accommodate other design features that permit more secure separation and/or easier access of racks within a modular section. FIG. 4C is a conceptual diagram illustrating a top view of an example modular section 430 of a data hall that includes data hall expansion modules and aisle expansion modules, in accordance with one or more aspects of the present disclosure. Modular section 420 may include similar modular components as module section 420 of FIG. 4B, including data hall base modules 402A and 402B, AHU modules 404A and 404B, electric power module 406, and data hall expansion modules 422A, 422B, 422C, and 422D. However, modular section 430 may also include two side aisle modules 432A and 432B (referred to individually as "side aisle module 432" and collectively as "side aisle modules 432″) and a central aisle module 434. Each side aisle module 432 may be positioned along an outer edge of a respective data hall base module 402A or 402B and respective data hall expansion modules 422A and 422B or 422C and 422D, while central aisle module 434 may be positioned between data hall base modules 402A and data hall expansion modules 422A and 422B, and data hall base module 402B and data hall expansion modules 422C and 422D. While described as modules, side aisle modules 432 and central aisle module 434 may be assembled on-site from relatively standard sections.

Figure 4D:
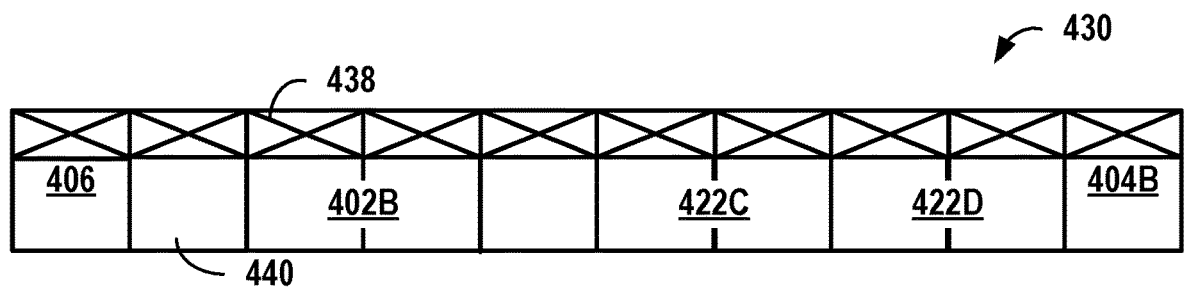
FIG. 4D is a conceptual diagram illustrating a side, wide view of the example modular section of FIG. 4C, in accordance with one or more aspects of the present disclosure.
Figure 4E:
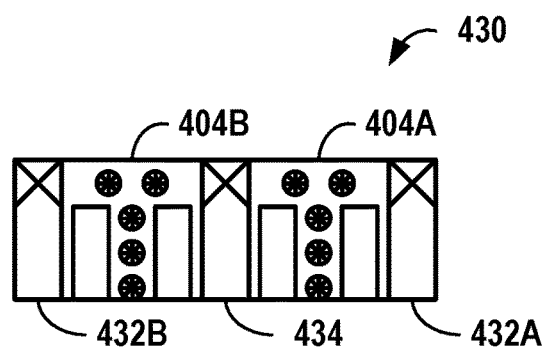
FIG. 4E is a conceptual diagram illustrating a side, length view of the example modular section of FIG. 4C, in accordance with one or more aspects of the present disclosure.

Aisle modules 432 and 434 may be configured to permit access to a rear of racks within data hall base modules 402 and data hall expansion modules 422. FIG. 4D is a conceptual diagram illustrating a side, wide view of the example modular section 430 of FIG. 4C, while FIG. 4E is a conceptual diagram illustrating a side, length view of the example module section 430 of FIG. 4C, in accordance with one or more aspects of the present disclosure. Aisle modules 432 and 434 include overhead supports 438 above a walkway of each of aisle modules 432 and 434 and panels 440 forming a wall between aisle modules 432 and 434 and data hall base modules 402 and data hall expansion modules 422. Supports 438 may be configured to support panels 440, permit access and removal of panels 440, permit an open volume above racks in data hall modules 402 and 422 (e.g., by moving supports to aisle modules 432 and 434, rather than in data hall modules 402 and 422), and/or permit continuous expansion of data hall modules 402 and 422 (e.g., to permit flow of air from AHU modules 404 through data hall modules 402 and 422). Panels 440 may permit secure access to a rear of specific racks within data hall modules 402 and 422, such that relatively routine access may be provided as a complement to accessing the racks through repositioning the racks, as described in, for example, FIG. 1B above. In this way, racks of modular section 430 may be both positioned, such as through the rack systems described above, and accessed, such as through panel removal, relatively quickly and securely.

The techniques described throughout may be implemented by or as any one of a method, a device and a system according to the principles of the present disclosure. In addition, the techniques described throughout may be implemented in hardware, software, firmware, or any combination thereof. Various features described as modules, units or components may be implemented together in an integrated logic device or separately as discrete but interoperable logic devices or other hardware devices. In some cases, various features of electronic circuitry may be implemented as one or more integrated circuit devices, such as an integrated circuit chip or chipset.

If implemented in hardware, this disclosure may be directed to an apparatus such as a processor or an integrated circuit device, such as an integrated circuit chip or chipset. Alternatively or additionally, if implemented in software or firmware, the techniques may be realized at least in part by a computer-readable data storage medium comprising instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may comprise a computer data storage medium such as random-access memory (RAM), read-only memory (ROM), non-volatile random-access memory (NVRAM), electrically erasable programmable read-only memory (EEPROM), Flash memory, magnetic or optical data storage media, and the like. In some examples, an article of manufacture may comprise one or more computer-readable storage media.

In some examples, the computer-readable storage media may comprise non-transitory media. The term "non-transitory" may indicate that the storage medium is not embodied in a carrier wave or a propagated signal. In certain examples, a non-transitory storage medium may store data that can, over time, change (e.g., in RAM or cache).

The code or instructions may be software and/or firmware executed by processing circuitry including one or more processors, such as one or more digital signal processors (DSPs), general purpose microprocessors, application-specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

Various embodiments have been described. These and other embodiments are within the scope of the following examples.

What is claimed is:

1. A method comprising:
receiving, by a controller, a temperature measurement for a rack of a plurality of racks, wherein each rack of the plurality of racks is positioned in a respective rack station at a rack angle formed between an aisle axis of an aisle and a station axis of the respective rack station that is less than 90 degrees, wherein the plurality of racks is configured to receive cooling air from a forced air cooling system, wherein each rack of the plurality of racks is configured to receiving cooling liquid from a liquid cooling system, and wherein each rack of the plurality of racks is positioned to permit the cooling air to flow between the rack for which the temperature measurement is received and any adjacent racks;
determining, by the controller, whether the temperature measurement is greater than a first threshold;
in response to determining that the temperature measurement is greater than the first threshold, increasing, by the controller, a flow rate of the cooling air from the forced air cooling system to the plurality of racks; and
in response to determining that the flow rate of the cooling air is at or greater than a second threshold, increasing, by the controller, a flow rate of the cooling liquid from the liquid cooling system to the rack of the plurality of racks for which the temperature measurement is received.

2. The method of claim 1, further comprising:
determining, by the controller, whether the flow rate of the cooling air to the plurality of racks is at or greater than the second threshold; and
in response to determining that the flow rate is less than the second threshold, increasing, by the controller, the flow rate of the cooling air from the forced air cooling system to the plurality of racks.

3. The method of claim 2, wherein the second threshold corresponds to a maximum flow rate of the cooling air.

4. The method of claim 1,
wherein the aisle comprises an aisle guidance track defining the aisle axis,
wherein a plurality of rack stations is adjacent to the aisle, wherein the plurality of rack stations comprises a first plurality of rack stations on a first side of the aisle and a second plurality of rack stations on a second side of the aisle, and wherein each rack station of the plurality of rack stations comprises a station guidance track defining the station axis and configured to:

receive a rack from the aisle guidance track; and position the rack in the respective rack station at the rack angle formed between the aisle axis and the station axis that is less than 90 degrees.

5. The method of claim 1, wherein each rack station of the plurality of rack stations further comprises a connector configured to:

couple to a rack positioned in the respective rack station of the plurality of rack stations;

supply electrical power to the rack; and supply the cooling liquid to the rack.

6. The method of claim 5, wherein the rack is configured to provide the cooling liquid to at least one of a computing device in the rack or a processor in the computing device in the rack.

7. The method of claim 1, wherein increasing the flow rate of the cooling liquid to the rack comprises controlling a control valve assembly of the respective rack station.

8. The method of claim 1, wherein increasing the flow rate of the cooling air to the plurality of racks comprises controlling one or more fans of the forced air cooling system.

9. The method of claim 1, wherein the rack comprises:

a heat exchanger configured to receive the cooling liquid; and at least one fan configured to discharge air through the heat exchanger into a rack volume, and wherein the method further comprises, in response to determining that the temperature measurement is greater than the first threshold, increasing, by the controller, the flow rate of the discharged air from the rack using the at least one fan.

10. A data center rack system, comprising:

a plurality of rack stations adjacent to an aisle, wherein each rack station of the plurality of rack stations is configured to position a rack of a plurality of racks at a rack angle formed between an aisle axis of the aisle and a station axis of the respective rack station that is less than 90 degrees, wherein the plurality of racks is configured to receive cooling air from a forced air cooling system, wherein each rack of the plurality of racks is configured to receiving cooling liquid from a liquid cooling system, and wherein each rack of the plurality of racks is positioned to permit the cooling air to flow between the rack and any adjacent racks; and a controller configured to, for each rack of the plurality of racks:

receive a temperature measurement;

determine whether the temperature measurement is greater than a first threshold;

in response to determining that the temperature measurement is greater than the first threshold, increase a flow rate of the cooling air from the forced air cooling system to the plurality of racks; and in response to determining that the flow rate of the cooling air is at or greater than a second threshold, increase a flow rate of the cooling liquid from the liquid cooling system to the rack of the plurality of racks.

11. The data center rack system of claim 10, wherein the controller is further configured to:

determine whether the flow rate of the cooling air to the plurality of racks is at or greater than the second threshold; and in response to determining that the flow rate is less than the second threshold, increase the flow rate of the cooling air from the forced air cooling system to the plurality of racks.

12. The data center rack system of claim 11, wherein the second threshold corresponds to a maximum flow rate of the cooling air.

13. The data center rack system of claim 10, wherein the aisle comprises an aisle guidance track defining the aisle axis, wherein the plurality of rack stations is adjacent to the aisle, wherein the plurality of rack stations comprises a first plurality of rack stations on a first side of the aisle and a second plurality of rack stations on a second side of the aisle, and wherein each rack station of the plurality of rack stations comprises a station guidance track defining the station axis and configured to:

receive a rack from the aisle guidance track; and position the rack in the respective rack station at the rack angle formed between the aisle axis and the station axis that is less than 90 degrees.

14. The data center rack system of claim 10, wherein each rack station of the plurality of rack stations further comprises a connector configured to:

couple to a computing device in the rack positioned in the respective rack station of the plurality of rack stations;

supply electrical power to the computing device; and supply the cooling liquid to the rack.

15. The data center rack system of claim 14, wherein the rack is configured to provide the cooling liquid to at least one of a computing device in the rack or a processor in the computing device in the rack.

16. The data center rack system of claim 14, wherein the connector further comprises a control valve assembly configured to control a flow of the cooling liquid to the respective rack station.

17. The data center rack system of claim 14, wherein the connector is configured to couple to a top of the rack.

18. The data center rack system of claim 14, wherein each rack comprises:

a heat exchanger configured to receive the cooling liquid; and at least one fan configured to discharge air through the heat exchanger into a rack volume, and wherein the controller is configured to, in response to determining that the temperature measurement is greater than the first threshold, increase the flow rate of the discharged air from the rack using the at least one fan.

* * * * *